US012809273B2

(12) United States Patent
Kuiper et al.

(10) Patent No.: US 12,809,273 B2
(45) Date of Patent: Nov. 24, 2026

(54) SYSTEM AND METHOD USING A SET OF MULTI-STEP DEFECT DETECTION TESTS WITH DIFFERENT SENSITIVITY

(71) Applicant: ASML NETHERLANDS B.V., Veldhoven (NL)

(72) Inventors: Vincent Sylvester Kuiper, Monster (NL); Marija Trajanoska, Oegstgeest (NL); Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 468 days.

(21) Appl. No.: 17/869,550

(22) Filed: Jul. 20, 2022

(65) Prior Publication Data

US 2023/0023939 A1 Jan. 26, 2023

(51) Int. Cl.
*G03F 7/00* (2006.01)
*G06T 7/00* (2017.01)

(52) U.S. Cl.
CPC ........ *G03F 7/7065* (2013.01); *G03F 7/70625* (2013.01); *G06T 7/0004* (2013.01)

(58) Field of Classification Search
CPC ............... G03F 7/70625; G06T 7/0004; G06T 2207/10061; G06T 2207/30148; G06T 7/0006; H01L 22/12; H01J 2237/221; H01J 37/28; H01J 2237/2817
See application file for complete search history.

(56) References Cited

U.S. PATENT DOCUMENTS

| | | | |
|---|---|---|---|
| 8,712,184 | B1 | 4/2014 | Liao et al. |
| 9,436,985 | B1 | 9/2016 | Kuan et al. |
| 2002/0057831 | A1 | 5/2002 | Hiroi et al. |

(Continued)

FOREIGN PATENT DOCUMENTS

| | | | |
|---|---|---|---|
| EP | 1602121 | A2 | 12/2005 |
| EP | 2702595 | A1 | 3/2014 |

(Continued)

OTHER PUBLICATIONS

Office Action of the Intellectual Property Office of Taiwan issued in related Taiwanese Patent Application No. 111126951; mailed May 23, 2023 (5 pgs.).

*Primary Examiner* — Hwa Andrew Lee
(74) *Attorney, Agent, or Firm* — FINNEGAN, HENDERSON, FARABOW, GARRETT & DUNNER, LLP

(57) ABSTRACT

A data processing device for detecting defects in sample image data generated by a charged particle assessment system, the device comprising: a first processing module configured to receive a sample image datastream from the charged particle assessment system, the sample image datastream comprising an ordered series of data points representing an image of the sample, and to apply a first defect detection test to select a subset of the sample image datastream as first selected data, wherein the first defect detection test is a localised test which is performed in parallel with receipt of the sample image datastream; and a second processing module configured to receive the first selected data and to apply a second defect detection test to select a subset of the first selected data as second selected data.

20 Claims, 16 Drawing Sheets

(56) References Cited

U.S. PATENT DOCUMENTS

| | | | | |
|---|---|---|---|---|
| 2006/0008178 | A1* | 1/2006 | Seeger | G06T 15/20 382/284 |
| 2009/0206257 | A1 | 8/2009 | Gunji et al. | |
| 2013/0163851 | A1 | 6/2013 | Dalla-Torre et al. | |
| 2018/0182514 | A1 | 6/2018 | Sprengers | |
| 2019/0006147 | A1 | 1/2019 | Kastrup et al. | |
| 2019/0259564 | A1 | 8/2019 | Kruit et al. | |
| 2019/0259570 | A1 | 8/2019 | Kruit et al. | |
| 2020/0088659 | A1 | 3/2020 | Ma et al. | |
| 2020/0118784 | A1 | 4/2020 | Jiang et al. | |
| 2020/0203116 | A1 | 6/2020 | Winkler et al. | |
| 2021/0217582 | A1 | 7/2021 | Maassen et al. | |

FOREIGN PATENT DOCUMENTS

| | | | |
|---|---|---|---|
| EP | 2715768 | A2 | 4/2014 |
| EP | 3937204 | A1 | 1/2022 |
| EP | 4020565 | A1 | 6/2022 |
| JP | H02210249 | A | 8/1990 |
| JP | H0868772 | A | 3/1996 |
| JP | 2002148027 | A | 5/2002 |
| JP | 2009192345 | A | 8/2009 |
| JP | 2011507202 | A | 3/2011 |
| JP | 2016082027 | A | 5/2016 |
| JP | 2021107807 | A | 7/2021 |
| TW | 201937530 | A | 9/2019 |
| TW | 202030763 | A | 8/2020 |
| TW | 202043911 | A | 12/2020 |
| WO | WO 2019/129569 | A1 | 7/2019 |
| WO | 2020141094 | A1 | 7/2020 |

* cited by examiner

SYSTEM AND METHOD USING A SET OF MULTI-STEP DEFECT DETECTION TESTS WITH DIFFERENT SENSITIVITY

FIELD

The embodiments provided herein generally relate to data processing devices and methods, especially for use with or in charged particle assessment systems and methods of operating charged particle assessment systems.

BACKGROUND

When manufacturing semiconductor integrated circuit (IC) chips, undesired pattern defects, as a consequence of, for example, optical effects and incidental particles, inevitably occur on a substrate (i.e., wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection apparatuses with a charged particle beam have been used to inspect objects, which may be referred to as samples, for example to detect pattern defects. These apparatuses typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause signal electrons to be emitted from the surface, such as secondary electrons, backscattered electrons or Auger electrons. The signal electrons may be emitted from the material structure of the sample. By scanning the primary electron beam as the probing spot over the sample surface, signal electrons can be emitted across the surface of the sample. By collecting these emitted signal electrons from the sample surface, a pattern inspection apparatus may obtain an image representing characteristics of the material structure of the surface of the sample.

When a pattern inspection apparatus is used to detect defects on samples at a high throughput, a very large amount of image data is generated and must be processed to detect defects. In particular it is desirable to reduce noise from image data. U.S. Pat. Nos. 8,712,184 B1 and 9,436,985 B1 describe methods of reducing noise or improving signal-to-noise ratio in images obtained from scanning electron microscopes. In some cases, the rate of data generation can be too high to allow real time processing without a prohibitive amount of processing power and prior art methods are not easily optimized for high-speed processing of such massive amounts of data for example in real time. Data processing may therefore be an undesirable limit on the throughput of a pattern inspection apparatus.

SUMMARY

It is an object of the present disclosure to provide embodiments that reduce the computational cost of processing images generated by charged particle assessment apparatus to detect defects.

According to a first aspect of the disclosed embodiments, there is provided a data processing device for detecting defects in sample image data generated by a charged particle assessment system, the device comprising: a first processing module configured to receive a sample image datastream from the charged particle assessment system, the sample image datastream comprising an ordered series of data points representing an image of the sample, and to apply a first defect detection test to select a subset of the sample image datastream as first selected data, wherein the first defect detection test is a localised test which is performed in parallel with receipt of the sample image datastream; and a second processing module configured to receive the first selected data and to apply a second defect detection test to select a subset of the first selected data as second selected data.

According to a second aspect of the disclosed embodiments, there is provided a charged particle assessment system comprising a charged particle beam system and a data processing device as described above.

According to a third aspect of the disclosed embodiments, there is provided a method using a charged particle beam system of detecting defects in samples having a plurality of pattern repeat regions, the method comprising, in order a first scan of a first part of a first region of the pattern repeat regions to generate first scan image data; a second scan of a first part of a second region of the pattern repeat regions to generate second scan image data, the second region being spaced apart from the first region; a third scan of a first part of a third region of the pattern repeat regions to generate third scan image data, the third region being spaced apart from the first region and the second region; and a subsequent scan of a second part of the first region to generate fourth scan image data.

According to fourth aspect of the disclosed embodiments, there is provided a method, using a charged particle beam system, of detecting defects in a sample using a charged particle multi-beam comprising a plurality of sub-beams, the sample having a plurality of pattern repeat regions that are nominally identical regions, the method comprising, in order: a first scan of a first pattern repeat region of the sample using the charged particle multi-beam to generate first scan image data; a second scan of a second pattern repeat region of the sample using the charged particle multi-beam to generate a second scan image data, the second pattern repeat region being spaced apart from the first pattern repeat region; a third scan of a third pattern repeat region of the sample using the charged particle multi-beam to generate a third scan image data, the third pattern repeat region being spaced apart from the first pattern repeat region and the second pattern repeat region; and processing the first scan image data, the second scan image data and the third scan image data by comparing the first scan image data, the second scan image data and the third scan image data to identify a defect; wherein each sub-beam is assigned a portion of the first, second and third pattern repeat regions so that each scan comprises using the same sub-beam to scan corresponding portions of the respective pattern repeat regions; wherein the processing comprises comparing scan image data obtained by the same sub-beam from corresponding portions of respective pattern repeat regions.

According to fifth aspect of the disclosed embodiments, there is provided a method using a charged particle beam system of detecting defects in a sample using a charged particle multi-beam comprising a plurality of sub-beams, the sample having a plurality of pattern repeat regions that are nominally identical, the method comprising: successively scanning at least three different pattern repeat regions of the sample using the charged particle multi-beam to generate different first sample image data sets; processing the different first sample image data sets, by comparing the image data thereof regions to identify a defect; wherein each sub-beam is assigned a corresponding portion of each of the pattern repeat regions so that each scanning comprises using the same sub-beam to scan corresponding portions of the respective pattern repeat regions.

According to sixth aspect of the disclosed embodiments, there is provided a method of data processing for detecting defects in sample image data generated by a charged particle assessment system, the method comprising: receiving a sample image datastream from the charged particle assessment system, the sample image datastream comprising an ordered series of data points representing an image of the sample, applying a first defect detection test that is a localised test, the applying the first detection test comprising selecting a subset of the sample image datastream as first selected data, wherein the applying of the first defect detection test is in parallel with receiving of the sample image datastream; receiving the first selected data; and applying a second defect detection test, the applying of the second detection test comprising selecting a subset of the first selected data as second selected data.

BRIEF DESCRIPTION OF FIGURES

The above and other aspects of the present disclosure will become more apparent from the description of exemplary embodiments, taken in conjunction with the accompanying drawings.

Figure 1:
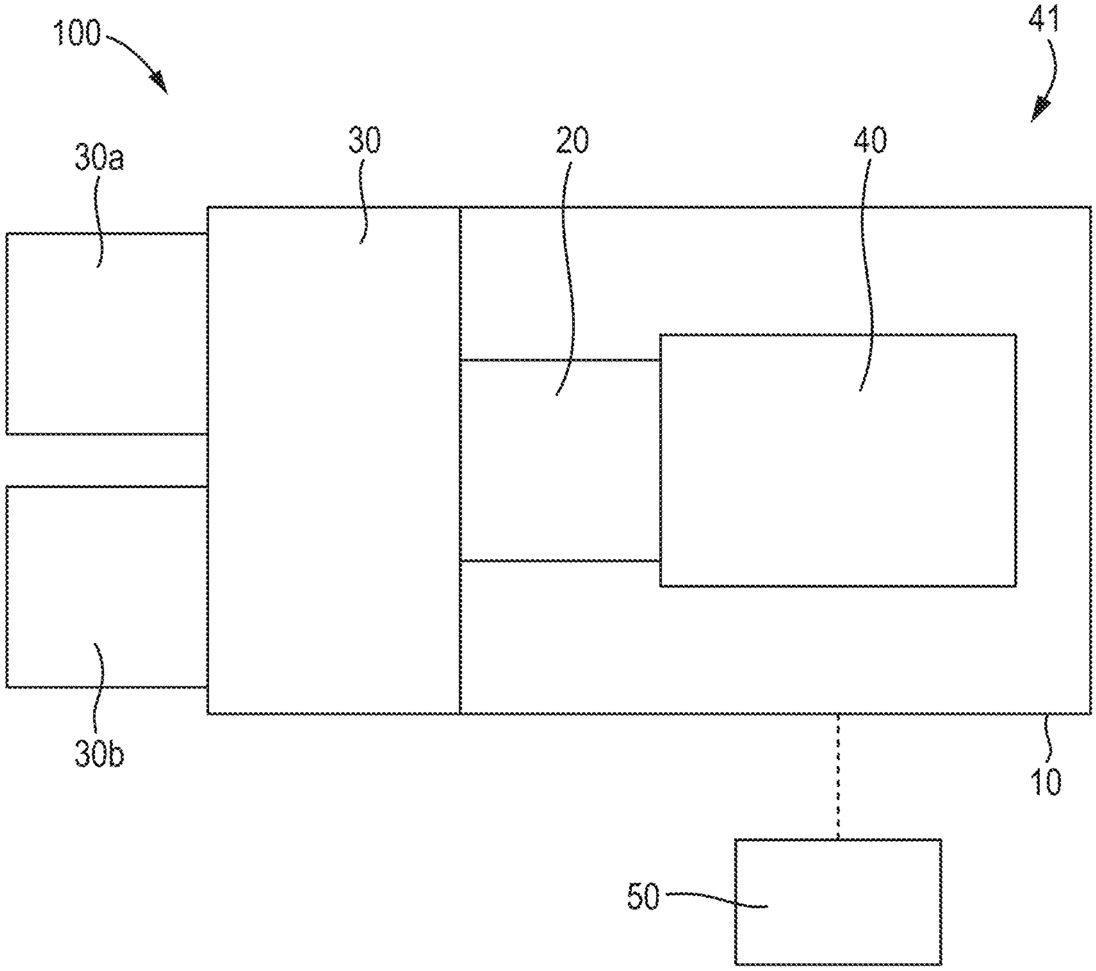
FIG. 1 is a schematic diagram illustrating an exemplary charged particle beam inspection system.

The schematic diagrams and views show the components described below. However, the components depicted in the figures are not to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e., wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection devices (such as a Scanning Electron Microscope (SEW)) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e., a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

While the description and drawings are directed to an electron-optical system, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection system 100, which may also be referred to as a charged particle beam assessment system or simply assessment system. The charged particle beam inspection system 100 of FIG. 1 includes a main chamber 10, a load lock chamber 20, an electron beam system 40, an equipment front end module (EFEM) 30 and a controller 50. The electron beam system 40 is located within the main chamber 10.

The EFEM 30 includes a first loading port 30*a* and a second loading port 30*b*. The EFEM 30 may include additional loading port(s). The first loading port 30*a* and the second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in the EFEM 30 transport the samples to the load lock chamber 20.

The load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from the load lock chamber 20 to the main chamber 10. The main chamber 10 is connected to a main chamber vacuum pump system (not shown). The main chamber vacuum pump system removes gas particles in the main chamber 10 so that the pressure in around the sample reaches a second pressure lower than the first pressure. After reaching the second pressure, the sample is transported to the electron beam system by which it may be inspected. An electron beam system 40 may comprise a multi-beam electron-optical apparatus.

The controller 50 is electronically connected to electron beam system 40. The controller 50 may be a processor (such as a computer) configured to control the charged particle beam inspection apparatus 100. The controller 50 may also include a processing circuitry configured to execute various signal and image processing functions. While the controller 50 is shown in FIG. 1 as being outside of the structure that includes the main chamber 10, the load lock chamber 20, and the EFEM 30, it is appreciated that the controller 50 may be part of the structure. The controller 50 may be located in one of the component elements of the charged particle beam inspection apparatus or it can be distributed over at least two of the component elements. While the present disclosure provides examples of the main chamber 10 housing an electron beam system, it should be noted that aspects of the disclosure in their broadest sense are not limited to a chamber housing an electron beam system. Rather, it is appreciated that the foregoing principles may also be applied to other devices, and other arrangements of apparatus, that operate under the second pressure.

Figure 2:
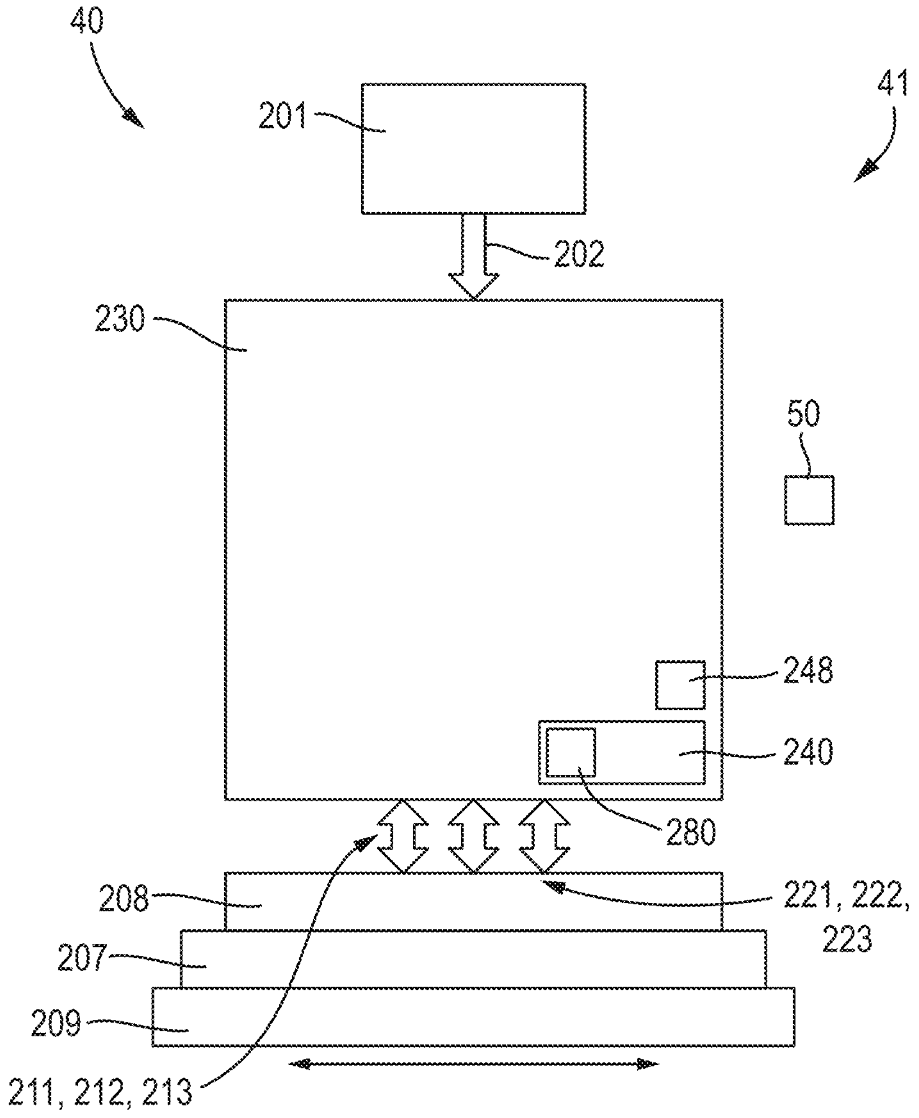
FIG. 2 is a schematic diagram illustrating an exemplary multi-beam charged particle assessment apparatus that is part of the exemplary charged particle beam inspection system of FIG. 1.

Reference is now made to FIG. 2, which is a schematic diagram illustrating an exemplary electron beam system 40, including a multi-beam electron-optical system 41, that is part of the exemplary charged particle beam inspection system 100 of FIG. 1. The electron beam system 40 comprises an electron source 201 and a projection apparatus 230. The electron beam system 40 further comprises a motorized stage 209 and a sample holder 207. The electron source 201 and projection apparatus 230 may together be referred to as the electron-optical system 41 or as an electron-optical column. The sample holder 207 is supported by motorized stage 209 so as to hold a sample 208 (e.g., a substrate or a mask) for inspection. The multi-beam electron-optical system 41 further comprises a detector 240 (e.g., an electron detection device).

The electron source 201 may comprise a cathode (not shown) and an extractor or anode (not shown). During operation, the electron source 201 is configured to emit electrons as primary electrons from the cathode. The primary electrons are extracted or accelerated by the extractor and/or the anode to form a primary electron beam 202.

The projection apparatus 230 is configured to convert the primary electron beam 202 into a plurality of sub-beams 211, 212, 213 and to direct each sub-beam onto the sample 208. Although three sub-beams are illustrated for simplicity, there may be many tens, many hundreds, many thousands, many tens of thousands or many hundreds of thousands of sub-beams. The sub-beams may be referred to as beamlets.

The controller 50 may be connected to various parts of the charged particle beam inspection apparatus 100 of FIG. 1, such as the electron source 201, the detector 240, the projection apparatus 230, and the motorized stage 209. The controller 50 may perform various image and signal processing functions. The controller 50 may also generate various control signals to govern operations of the charged particle beam inspection apparatus, including the charged particle multi-beam apparatus.

The projection apparatus 230 may be configured to focus sub-beams 211, 212, and 213 onto a sample 208 for inspection and may form three probe spots 221, 222, and 223 on the surface of sample 208. The projection apparatus 230 may be configured to deflect the primary sub-beams 211, 212, and 213 to scan the probe spots 221, 222, and 223 across individual scanning areas in a section of the surface of the sample 208. In response to incidence of the primary sub-beams 211, 212, and 213 on the probe spots 221, 222, and 223 on the sample 208, electrons are generated from the sample 208 which include secondary electrons and backscattered electrons which may be referred to as signal particles. The secondary electrons typically have electron energy less than or equal to 50 eV. Actual secondary electrons can have an energy of less than 5 eV, but anything beneath 50 eV is generally treated at a secondary electron. Backscattered electrons typically have electron energy between 0 eV and the landing energy of the primary sub-beams 211, 212, and 213. As electrons detected with an energy of less than 50 eV is generally treated as a secondary electron, a proportion of the actual backscatter electrons will be counted as secondary electrons.

The detector 240 is configured to detect signal particles such as secondary electrons and/or backscattered electrons and to generate corresponding signals which are sent to a signal processing system 280, e.g., to construct images of the corresponding scanned areas of sample 208. The detector 240 may be incorporated into the projection apparatus 230.

The signal processing system 280 may comprise a circuit (not shown) configured to process signals from the detector 240 so as to form an image. The signal processing system 280 could otherwise be referred to as an image processing system. The signal processing system may be incorporated into a component of the electron beam system 40 such as the detector 240 (as shown in FIG. 2). However, the signal processing system 280 may be incorporated into any number of components of the inspection apparatus 100 or electron beam system 40, such as, as part of the projection apparatus 230 or the controller 50. The signal processing system 280 may include an image acquirer (not shown) and a storage device (not shown). For example, the signal processing system may comprise a processor, computer, server, mainframe host, terminals, personal computer, any kind of mobile computing devices, and the like, or a combination thereof The image acquirer may comprise at least part of the processing function of the controller. Thus, the image acquirer may comprise at least one or more processors. The image acquirer may be communicatively coupled to the detector 240 permitting signal communication, such as an electrical conductor, optical fiber cable, portable storage media, IR, Bluetooth, internet, wireless network, wireless radio, among others, or a combination thereof. The image acquirer may receive a signal from the detector 240, may process the data comprised in the signal and may construct an image therefrom. The image acquirer may thus acquire images of the sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The signal processing system 280 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of the sample 208. The reconstructed images can thereby be used to reveal any defects that may exist in the sample. The above functions of the signal processing system 280 may be carried out in the controller 50 or shared between the signal processing systems 280 and controller 50 as convenient.

The controller 50 may control the motorized stage 209 to move sample 208 during inspection of the sample 208. The controller 50 may enable the motorized stage 209 to move the sample 208 in a direction, preferably continuously, for example at a constant speed, at least during sample inspection, which may be referred to as a type of scanning The controller 50 may control movement of the motorized stage 209 so that it changes the speed of the movement of the sample 208 dependent on various parameters. For example, the controller 50 may control the stage speed (including its direction) depending on the characteristics of the inspection steps of scanning process and/or scans of the scanning process for example as disclosed in EPA 21171877.0 filed 3 May 2021 which is hereby incorporated in so far as the combined stepping and scanning strategy at least of the stage.

Known multi-beam systems, such as the electron beam system 40 and charged particle beam inspection apparatus 100 described above, are disclosed in US2020118784, US20200203116, US 2019/0259570 and US2019/0259564 which are hereby incorporated by reference.

The electron beam system 40 may comprise a projection assembly to regulate accumulated charges on the sample by illuminating the sample 208.

Figure 3:
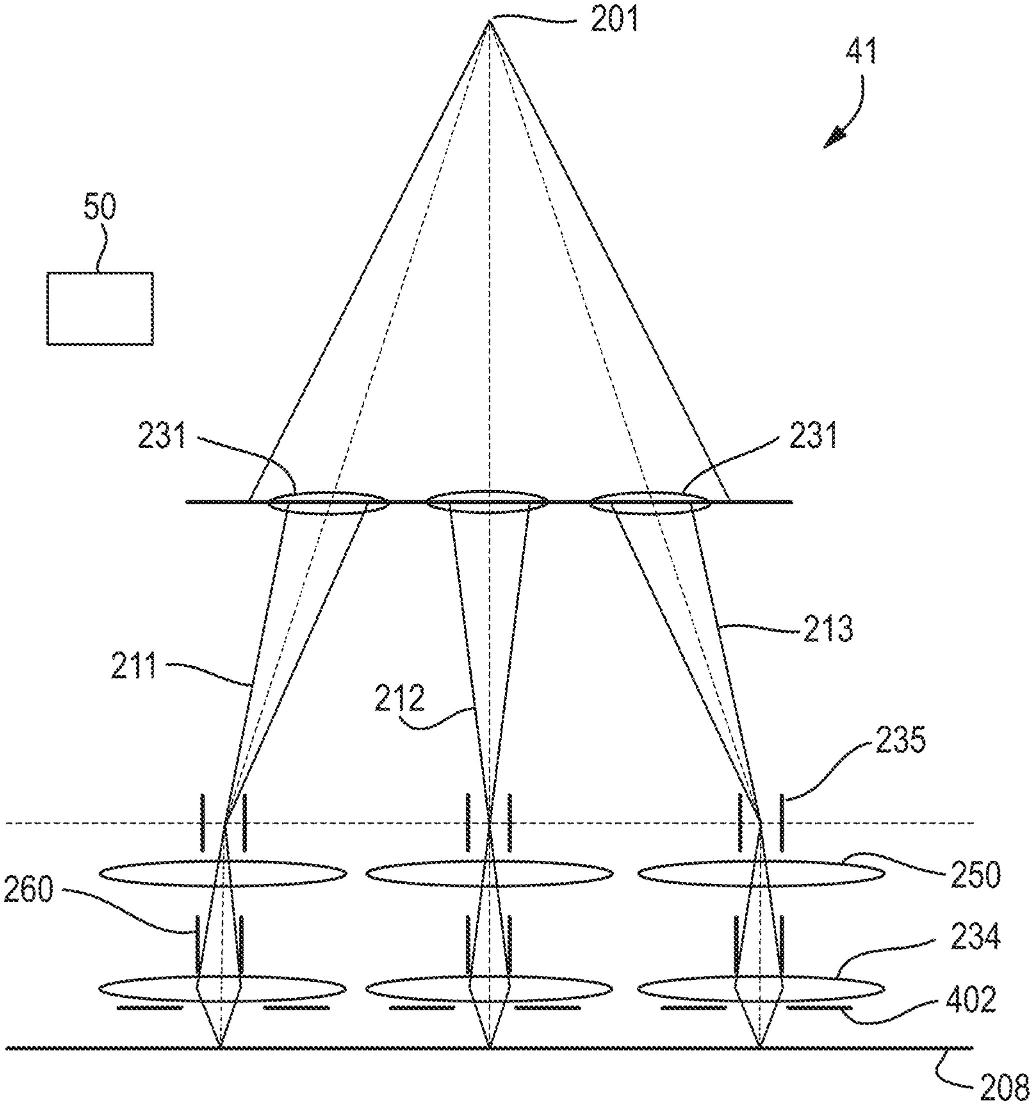
FIG. 3 is a schematic diagram of an exemplary electron optical column comprising a condenser lens array.

FIG. 3 is a schematic diagram of an exemplary electron-optical column 41 for use in an assessment system. For ease of illustration, lens arrays are depicted schematically herein by arrays of oval shapes. Each oval shape represents one of the lenses in the lens array. The oval shape is used by convention to represent a lens, by analogy to the biconvex form often adopted in optical lenses. In the context of charged particle arrangements such as those discussed herein, it will be understood however that lens arrays will typically operate electrostatically and so may not require any physical elements adopting a biconvex shape. As described below, lens arrays may instead comprise multiple plates with apertures. Each plate with apertures may be referred to as an electrode. The electrodes may be provided in series along sub-beam paths of sub-beams of a multi-beam.

The electron source 201 directs electrons toward an array of condenser lenses 231 (otherwise referred to as a condenser lens array). The electron source 201 is desirably a high brightness thermal field emitter with a good compromise between brightness and total emission current. There may be many tens, many hundreds or many thousands of condenser lenses 231. The condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The array of condenser lenses 231 may take the form of at least two plates, preferably three, acting as electrodes, with an aperture in each plate aligned with each other and corresponding to the location of a sub-beam. At least two of the plates are maintained during operation at different potentials to achieve the desired lensing effect. Between the plates of the condenser lens array are electrically insulating plates for example made of an insulating material such as ceramic or glass, with one or more apertures for the sub-beams. An alternative arrangement one more of the plates may feature apertures each with their own electrode, each with an array of electrodes around their perimeter or arranged in groups of apertures having a common electrode.

In an arrangement the array of condenser lenses 231 is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g., a few mm, such aberrations have a small or negligible effect.

Each condenser lens in the array directs electrons into a respective sub-beam 211, 212, 213 which is focused at a respective intermediate focus 233. A collimator or an array of collimators may be positioned to operate on the respective intermediate focus 233. The collimators may take the form of deflectors 235 provided at the intermediate focuses 233. Deflectors 235 are configured to bend a respective beamlet 211, 212, 213 by an amount effective to ensure that the principal ray (which may also be referred to as the beam axis) is incident on the sample 208 substantially normally (i.e., at substantially 90° to the nominal surface of the sample).

Below (i.e., downbeam of or further from source 201) deflectors 235 there is a control lens array 250 comprising a control lens 251 for each sub-beam 211, 212, 213. Control lens array 250 may comprise two or more, preferably at least three, plate electrode arrays connected to respective potential sources, preferably with insulating plates in contact with the electrodes for example between the electrodes. Each of the plate electrode arrays may be referred to as a control electrode. A function of control lens array 250 is to optimize the beam opening angle with respect to the demagnification of the beam and/or to control the beam energy delivered to the objective lenses 234, each of which directs a respective sub-beam 211, 212, 213 onto the sample 208.

Optionally an array of scan deflectors 260 is provided between the control lens array 250 and the array of objective lenses 234 (objective lens array). The array of scan deflectors 260 comprises a scan deflector 261 for each sub-beam 211, 212, 213. Each scan deflector is configured to deflect a respective sub-beam 211, 212, 213 in one or two directions so as to scan the sub beam across the sample 208 in one or two directions.

A detector module 240 of a detector is provided within or between the objective lenses 234 and the sample 208 to detect signal electrons/particles emitted from the sample 208. An exemplary construction of such a detector module 240 is described below. Note that the detector additionally or alternative may have detector elements up-beam along the primary beam path of the objective lens array or even the control lens array.

Figure 4:
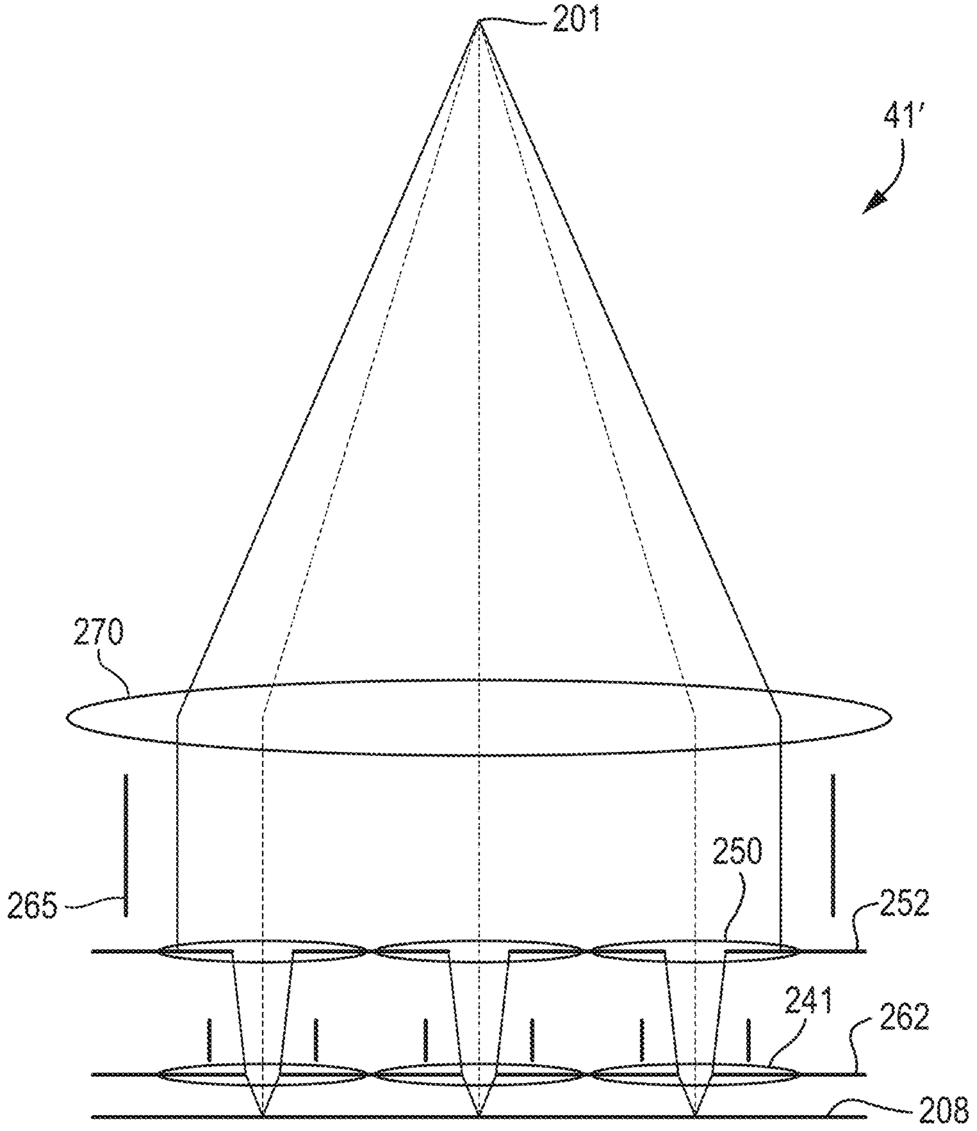
FIG. 4 is a schematic diagram of an exemplary electron optical column comprising a macro collimator and macro scan deflector.

FIG. 4 is a schematic diagram of an exemplary electron beam system having an alternative electron-optical column 41'. The electron-optical column 41' comprises an objective lens array 241. The objective lens array 241 comprises a plurality of objective lenses. The objective lens array 241 may be an exchangeable module. For conciseness, features of the electron beam system that have already been described above may not be repeated here.

As shown in FIG. 4, the electron-optical column 41' comprises a source 201. The source 201 provides a beam of charged particles (e.g., electrons). The multi-beam focused on the sample 208 is derived from the beam provided by the source 201. Sub-beams may be derived from the beam, for example, using a beam limiter defining an array of beam-limiting apertures. The beam may separate into the sub-beams on meeting the control lens array 250. The sub-beams are substantially parallel on entry to the control lens array 250. The sub-beams of the multi-beam may be arranged in a pattern which may be referred to as a multi-beam arrangement. The pattern may form a grid. The grid may be hexagonal, rectilinear, rhombic or square. In the example shown, a collimator is provided up-beam of the objective lens array assembly.

The collimator may comprise a macro collimator 270. The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e., at substantially 90° to the nominal surface of the sample 208). The macro collimator 270 comprise a magnetic lens and/or an electrostatic lens. In another arrangement (not shown), the macro-collimator may be partially or wholly replaced by a collimator element array provided down-beam of the upper beam limiter.

In the electron-optical column 41' of FIG. 4 a macro scan deflector 265 is provided to cause sub-beams to be scanned over the sample 208. The macro scan deflector 265 deflects respective portions of the beam to cause the sub-beams to be scanned over the sample 208. In some embodiments, the macro scan deflector 265 comprises a macroscopic multi-pole deflector, for example with eight poles or more. The deflection is such as to cause sub-beams derived from the beam to be scanned across the sample 208 in one direction (e.g., parallel to a single axis, such as an X axis) or in two directions (e.g., relative to two non-parallel axes, such as X and Y axes). The macro scan deflector 265 acts macroscopically on all of the beam rather than comprising an array of deflector elements that are each configured to act on a different individual portion of the beam. In the example shown, the macro scan deflector 265 is provided between the macro collimator 270 and the control lens array 250. In another arrangement (not shown), the macro scan deflector 265 may be partially or wholly replaced by a scan deflector array, for example as a scan deflector for each sub-beam. In other embodiments both a macro scan deflector 265 and the scan-deflector array are provided, and they may operate in synchronization.

In some embodiments, the electron-optical system 41 further comprises an upper beam limiter 252. The upper beam limiter 252 defines an array of beam-limiting apertures. The upper beam limiter 252 may be referred to as an upper beam-limiting aperture array or up-beam beam-limiting aperture array. The upper beam limiter 252 may comprise a plate (which may be a plate-like body) having a plurality of apertures. The upper beam limiter 252 forms sub-beams from a beam of charged particles emitted by the source 201. Portions of the beam other than those contributing to forming the sub-beams may be blocked (e.g., absorbed) by the upper beam limiter 252 so as not to interfere with the sub-beams down-beam. The upper beam limiter 252 may be referred to as a sub-beam defining aperture array.

In some embodiments, as exemplified in FIG. 4, the objective lens array assembly (which is a unit that comprises the objective lens array 241) further comprises a beam shaping limiter 262. The beam shaping limiter 262 defines an array of beam-limiting apertures. The beam shaping limiter 262 may be referred to as a lower beam limiter, lower beam-limiting aperture array or final beam-limiting aperture array. The beam shaping limiter 262 may comprise a plate (which may be a plate-like body) having a plurality of apertures. The beam shaping limiter 262 may be down-beam from at least one electrode (optionally from all electrodes) of the control lens array 250. In some embodiments, the beam shaping limiter 262 is down-beam from at least one electrode (optionally from all electrodes) of the objective lens array 241. In an arrangement, the beam shaping limiter 262 is structurally integrated with an electrode of the objective lens array 241. Desirably, the beam shaping limiter 262 is positioned in a region of low electrostatic field strength. The alignment of the beam liming apertures with the objective lens array is such that a portion of a sub-beam from the corresponding objective lens can pass through the beam-limiting aperture and impinge onto the sample 208, so that only a selected portion of the sub-beam incident onto the beam shaping limiter 262 to pass through the beam-limiting aperture.

Any of the objective lens array assemblies described herein may further comprise a detector 240. The detector detects electrons emitted from the sample 208. The detected electrons may include any of the electrons detected by an SEM, including signal particles such as secondary and/or backscattered electrons emitted from the sample 208. An exemplary construction of a detector 240 is described in more detail below with reference to FIGS. 6 and 7.

Figure 5:
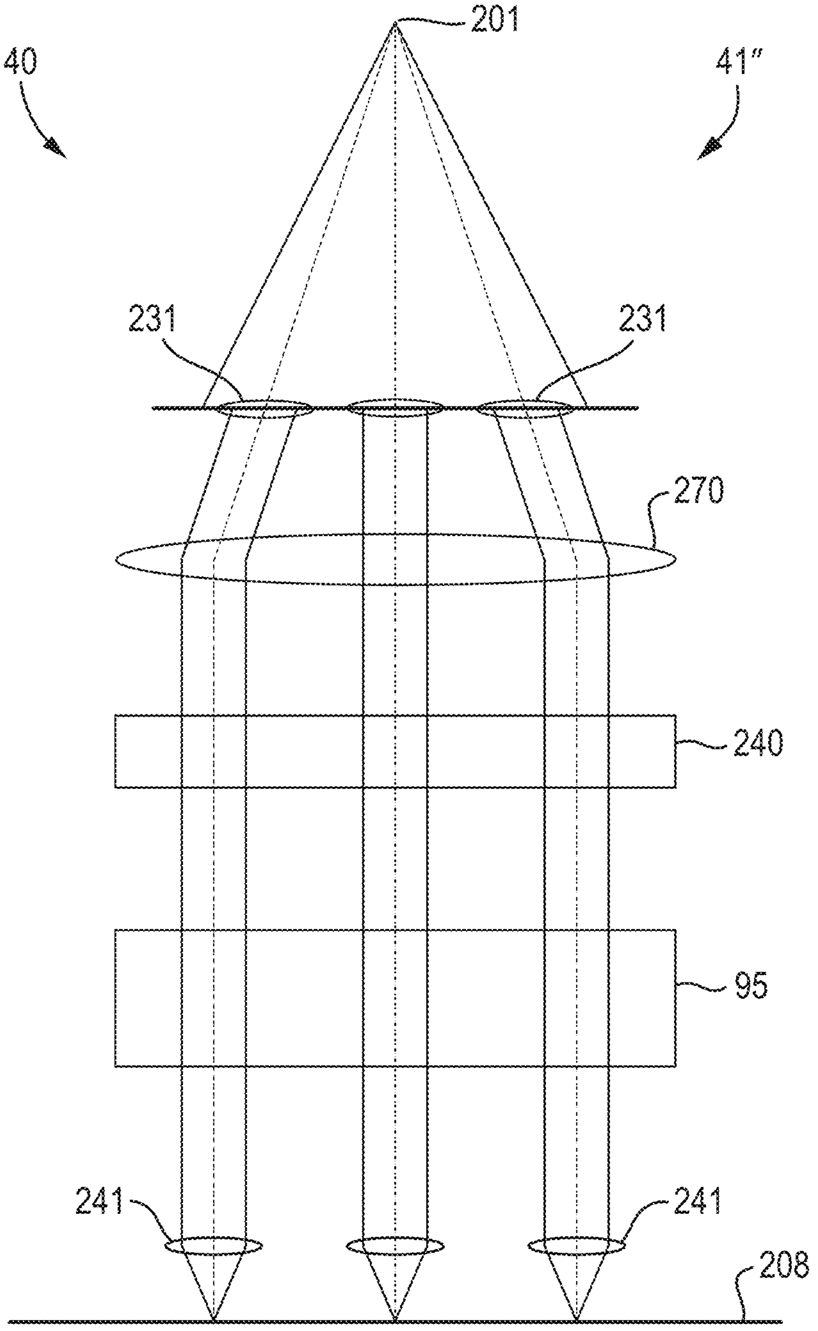
FIG. 5 is a schematic diagram of an exemplary electron optical column comprising a beam separator.

FIG. 5 schematically depicts an electron beam system 40 including an electron-optical column 41" according to some embodiments. Features that are the same as those described above are given the same reference numerals. For conciseness, such features are not described in detail with reference to FIG. 5. For example, the source 201, the condenser lenses 231, the macro collimator 270, the objective lens array 241 and the sample 208 may be as described above.

As described above, in some embodiments the detector 240 is between the objective lens array 241 and the sample 208. The detector 240 may face the sample 208. Alternatively, as shown in FIG. 5, in some embodiments the objective lens array 241, which comprises the plurality of objective lenses, is between the detector 240 and the sample 208.

In some embodiments a deflector array 95 is between the detector 240 and the objective lens array 241. In some embodiments the deflector array 95 comprises a Wien filter array so that deflector array may be referred to as a beam separator. The deflector array 95 is configured to provide a magnetic field to disentangle the charged particles projected to the sample 208 apart from the secondary electrons from the sample 208 towards the detector 240.

Figure 6:
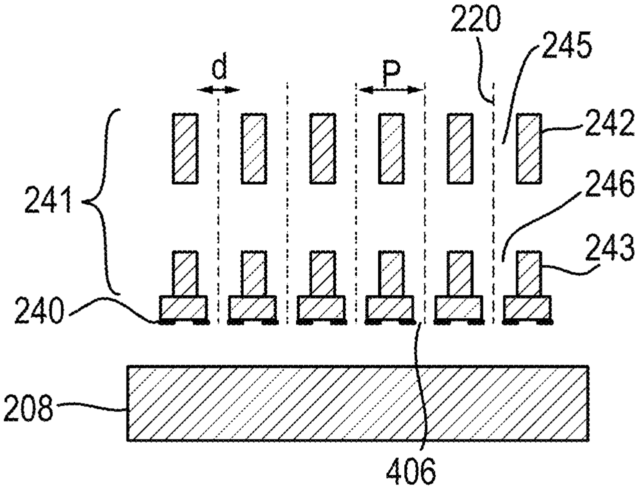
FIG. 6 is a schematic cross-sectional view of an objective lens array of a charged particle assessment system, according to some embodiments of the present disclosure.

In some embodiments the detector 240 is configured to detect signal particles by reference to the energy of the charged particle, i.e., dependent on a band gap. Such a detector 240 may be called an indirect current detector. The secondary electrons emitted from the sample 208 gain energy from the fields between the electrodes. The secondary electrodes have sufficient energy once they reach the detector 240. In a different arrangement the detector 240 may be a scintillator array of for example of fluorescing strip between the beams and that are positioned up beam along the primary beam path with respect to the Wien filter. Primary beams passing through the Wien filter array (of magnetic and electrostatic strips orthogonal to the primary beam path) have paths up beam and down beam of the Wien filter array that substantially parallel; whereas signal electrons from the sample are directed to the Wien filter array towards the scintillator array. The generated photons are directed via a photon transport unit (e.g., an array of optical fibers) to a remote optical detector which generates a detection signal on detection of a photon The objective lens array 241 of any embodiments may comprise at least two electrodes in which are defined aperture arrays. In other words, the objective lens array comprises at least two electrodes with a plurality of holes or apertures. FIG. 6 shows electrodes 242, 243 which are part of an exemplary objective lens array 241 having respective aperture arrays 245, 246. The position of each aperture in an electrode corresponds to the position of a corresponding aperture in another electrode. The corresponding apertures operate in use on the same beam, sub-beam or group of beams in the multi-beam. In other words, corresponding apertures in the at least two electrodes are aligned with and arranged along a sub-beam path, i.e., one of the sub-beam paths 220. Thus, the electrodes are each provided with apertures through which the respective sub-beam 211, 212, 213 propagates.

The objective lens array 241 may comprise two electrodes, as shown in FIG. 6, or three electrodes, or may have more electrodes (not shown). An objective lens array 241 having only two electrodes can have lower aberration than an objective lens array 241 having more electrodes. A three-electrode objective lens can have greater potential differences between the electrodes and so enable a stronger lens. Additional electrodes (i.e., more than two electrodes) provide additional degrees of freedom for controlling the electron trajectories, e.g., to focus secondary electrons as well as the incident beam. A benefit of two electrode lens over an Einzel lens is that the energy of an incoming beam is not necessarily the same as an out-going beam. Beneficially the potential differences on such a two-electrode lens array enables it to function as either an accelerating or a decelerating lens array.

Adjacent electrodes of the objective lens array 241 are spaced apart from each other along the sub-beam paths. The distance between adjacent electrodes, in which an insulating structure might be positioned as described below, is larger than an objective lens of the objective lens array.

Preferably, each of the electrodes provided in the objective lens array 241 is a plate. The electrode may otherwise be described as a flat sheet. Preferably, each of the electrodes is planar. In other words, each of the electrodes will preferably be provided as a thin, flat plate, in the form of a plane. Of course, the electrodes are not required to be planar. For example, the electrode may bow due to the force due to the high electrostatic field. It is preferable to provide a planar electrode because this makes manufacturing of the electrodes easier as known fabrication methods can be used. Planar electrodes may also be preferable as they may provide more accurate alignment of apertures between different electrodes.

The objective lens array 241 can be configured to demagnify the charged particle beam by a factor greater than 10, desirably in the range of 50 to 100 or more.

A detector 240 is provided to detect signal particles, i.e., secondary and/or backscattered charged particles, emitted from the sample 208. The detector 240 is positioned between the objective lenses 234 and the sample 208. On direction of a signal particle the detector generates a detection signal. The detector 240 may otherwise be referred to as a detector array or a sensor array, and the terms "detector" and "sensor" are used interchangeably throughout the application.

An electron-optical device for the electron-optical system 41 may be provided. The electron-optical device is configured to project a beam of electrons towards the sample 208. The electron-optical device may comprise the objective lens array 241. The electron-optical device may comprise the detector 240. The array of objective lenses (i.e., the objective lens array 241) may correspond with the array of detectors (i.e., the detector 240) and/or any of the beams (i.e., the sub-beams).

An exemplary detector 240 is described below. However, any reference to the detector 240 could be a single detector (i.e., at least one detector) or multiple detectors as appropriate. The detector 240 may comprise detector elements 405 (e.g., sensor elements such as capture electrodes). The detector 240 may comprise any appropriate type of detector. For example, capture electrodes for example to detect directly electron charge, scintillators or PIN elements can be used. The detector 240 may be a direct current detector or an indirect current detector. The detector 240 may be a detector as described below in relation to FIG. 7.

The detector 240 may be positioned between the objective lens array 241 and the sample 208. The detector 240 is configured to be proximate the sample 208. The detector 240 may be very close to the sample 208. Alternatively, there may be a larger gap from the detector 240 to the sample 208. The detector 240 may be positioned in the device so as to face the sample 208. Alternatively, the detector 240 may be positioned elsewhere in the electron-optical system 41 such that part of the electron-optical device that is not a detector faces the sample 208.

Figure 7:
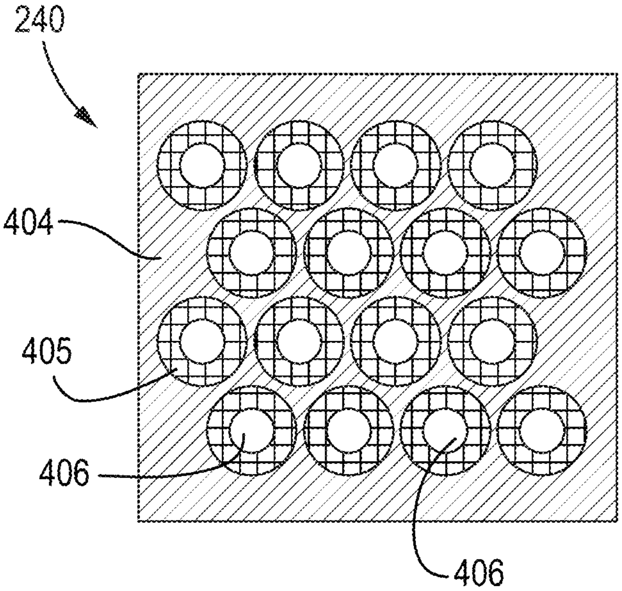
FIG. 7 is a bottom view of a modification of the objective lens array of FIG. 6, according to some embodiments of the present disclosure.

FIG. 7 is a bottom view of the detector 240 which comprises a substrate 404 on which are provided a plurality of detector elements 405 each surrounding a beam aperture 406. The beam apertures 406 may be formed by etching through the substrate 404. In the arrangement shown in FIG. 7, the beam apertures 406 are in a hexagonal close packed array. The beam apertures 406 can also be differently arranged, e.g., in a rectangular, or a rhombic, array. The beam arrangement of the hexagonal arrangement in FIG. 7 may be more densely packed than a square beam arrangement. The detector elements 405 may be arranged in a rectangular array or a hexagonal array. The beam apertures may correspond to the multi-beam arrangement of the sub-beams towards the substrate 404.

Capture electrodes 405 form the bottommost, i.e., most close to the sample, surface of the detector module 240. Between the capture electrodes 405 and the main body of the silicon substrate 404 a logic layer is provided. Logic layer may include amplifiers, e.g., Trans Impedance Amplifiers, analogue to digital converters, and readout logic. In some embodiments, there is one amplifier and one analogue to digital converter per capture electrode 405. A circuit featuring these elements may be comprised in a unit area referred to as a cell that is associated with an aperture. The detector model 240 may have several cells each associated with an aperture. Within or on the substrate is a wiring layer connected to the logic layer and externally connecting the logic layer of each cell for example via power, control and data lines. The integrated detector module 240 described above is particularly advantageous when used with a system having tunable landing energy as secondary electron capture can be optimized for a range of landing energies. A detector module in the form of an array can also be integrated into other electrode arrays, not only the lowest electrode array. Such a detector module may feature detectors that are scintillators or semiconductor detectors such as PIN detectors, for example above the down-beam most surface of the objective lens. Such detector modules may feature a similar circuit architecture as a detector module comprising a current detector. Further details and alternative arrangements of a detector module integrated into an objective lens can be found in EP Application Numbers 20184160.8 and 20217152.6, which document is hereby incorporated by reference at least so far as details of the detector module.

The detector may be provided with multiple portions and more specifically, multiple detecting portions. The detector comprising multiple portions may be associated with one of the sub-beams 211, 212, 213. Thus, the multiple portions of one detector 240 may be configured to detect signal particles emitted from the sample 208 in relation to one of the primary beams (which may otherwise be referred to as sub-beams 211, 212, 213). In other words, the detector comprising multiple portions may be associated with one of the apertures in at least one of the electrodes of the objective lens assembly. More specifically, the detector 405 comprising multiple portions may be arranged around a single aperture 406, which provides an examples of such a detector. As mentioned, the detection signal from the detector module is used to generate an image. With multiple detecting portions, the detection signal comprises components from the different detecting signals that may be processed as data sets or in a detection image.

In some embodiments, the objective lens array 241 is an exchangeable module, either on its own or in combination with other elements such as the control lens array and/or detector array. The exchangeable module may be field replaceable, i.e., the module can be swapped for a new module by a field engineer. In some embodiments, multiple exchangeable modules are contained within the system and can be swapped between operable and non-operable positions without opening the electron beam system.

In some embodiments, one or more aberration correctors are provided that reduce one or more aberrations in the sub-beams. Aberration correctors positioned in, or directly adjacent to, the intermediate foci (or intermediate image plane) may comprise deflectors to correct for the source 201 appearing to be at different positions for different beams. Correctors can be used to correct macroscopic aberrations resulting from the source that prevent a good alignment between each sub-beam and a corresponding objective lens. Aberration correctors may correct aberrations that prevent a proper column alignment. Aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference. Aberration correctors may reduce one or more of the following: field curvature; focus error; and astigmatism.

The disclosed embodiments can be applied to various different system architectures. For example, the electron beam system may be a single beam system or may comprise a plurality of single beam columns or may comprise a plurality of columns of multi-beams. The columns may comprise the electron-optical system 41 described in any of the above embodiments or aspects. As a plurality of columns (or a multi-column system), the devices may be arranged in an array which may number two to one hundred columns or more. The electron beam system may take the form of the system depicted in FIG. 3 or depicted in FIG. 4, although preferably having an electrostatic scan deflector array and an electrostatic collimator array.

Figure 8:
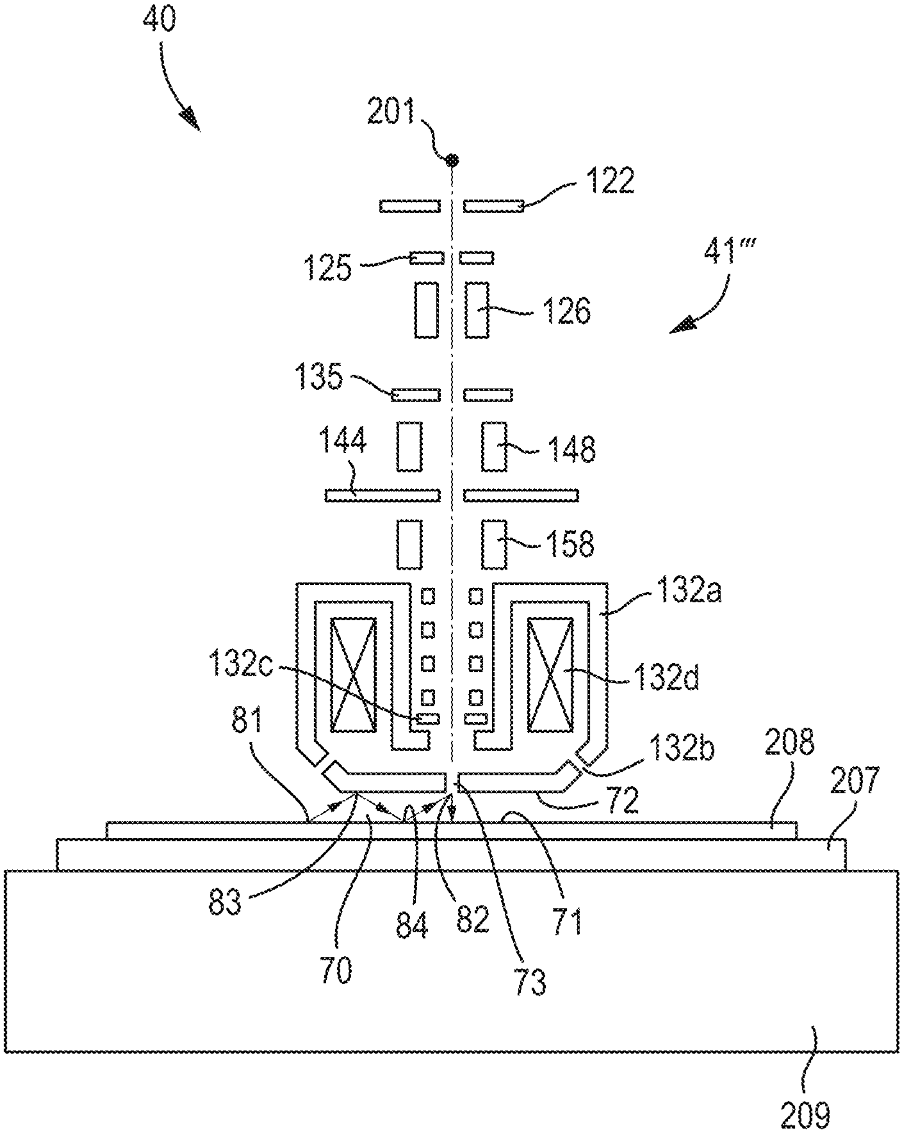
FIG. 8 is a schematic diagram of an exemplary single beam electron optical column.

FIG. 8 is a schematic diagram of an exemplary single beam electron beam system 41''' according to some embodiments. As shown in FIG. 8, in some embodiments the electron beam system comprises a sample holder 207 supported by a motorized stage 209 to hold a sample 208 to be inspected. The electron beam system comprises an electron source 201. The electron beam system further comprises a gun aperture 122, a beam limit aperture 125, a condenser lens 126, a column aperture 135, an objective lens assembly 132, and an electron detector 144. The objective lens assembly 132, in some embodiments, may be a modified swing objective retarding immersion lens (SORIL), which includes a pole piece 132*a*, a control electrode 132*b*, a deflector 132*c*, and an exciting coil 132*d*. The control electrode 132*b* has an aperture formed in it for the passage of the electron beam.

The control electrode 132*b* forms the facing surface 72, described in more detail below.

In an imaging process, an electron beam emanating from the source 201 may pass through the gun aperture 122, the beam limit aperture 125, the condenser lens 126, and be focused into a probe spot by the modified SORIL lens and then impinge onto the surface of sample 208. The probe spot may be scanned across the surface of the sample 208 by the deflector 132*c* or other deflectors in the SORIL lens. Secondary electrons emanated from the sample surface may be collected by the electron detector 144 to form an image of an area of interest on the sample 208.

The condenser and illumination optics of the electron-optical system 41 may comprise or be supplemented by electromagnetic quadrupole electron lenses. For example, as shown in FIG. 8 the electron-optical system 41 may comprise a first quadrupole lens 148 and a second quadrupole lens 158. In some embodiments, the quadrupole lenses are used for controlling the electron beam. For example, first quadrupole lens 148 can be controlled to adjust the beam current and second quadrupole lens 158 can be controlled to adjust the beam spot size and beam shape.

Figure 9:
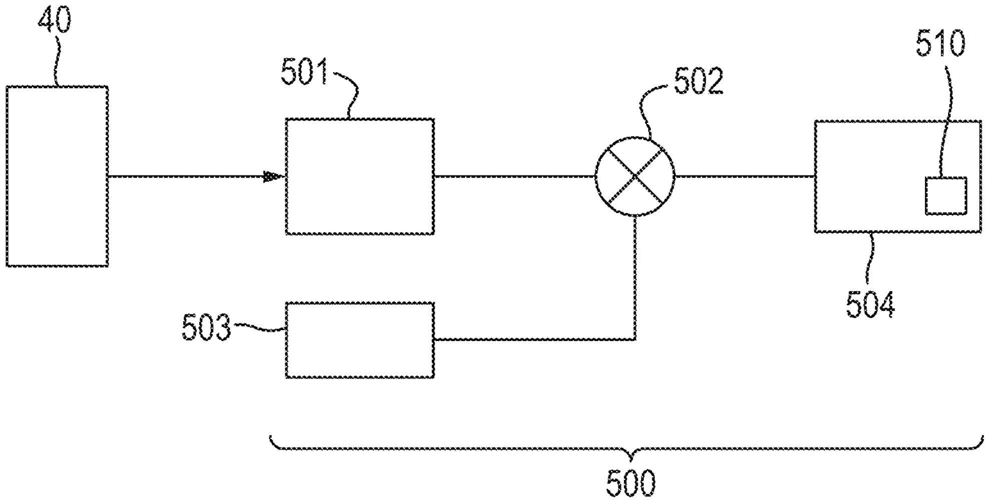
FIG. 9 is a schematic diagram of a data path, according to some embodiments of the present disclosure.

Images output from a charged particle assessment device, e.g., electron beam system 40 need to be processed automatically to detect defects in samples being assessed. A data processing device 500 for detecting defects in images generated by a charged particle assessment device is depicted in FIG. 9. Data processing device 500 may be part of controller 50, part of another computer in the fab or integrated elsewhere in the charged particle assessment device. It should be noted that the arrangement of components of the data processing device 500 as shown and described with reference to FIG. 9 is exemplary and is provided to aid explanation of the functions of data processors that operate on the images generated by the charged particle assessment device. Any feasible arrangement conceivable by a person skilled in the art of data processors that is able to achieve the functions of the data processing device 500 as described herein may be used.

The charged particle assessment device may have a high throughput and a high resolution, meaning that data may be output at a high rate. For example, the charged particle assessment device may have thousands, even tens of thousands, of beams or more, with each beam having one or more detector portions outputting data points at a rate of kilo- or mega-Hertz. It is desirable that data is processed at a rate equal to or at least similar to the rate of output from the charged particle assessment system 40. Known image processing approaches for detecting defects when applied to multi-beam or multi-column charged particle assessment devices require a prohibitive amount of processing power to keep up with the rate of image generation.

Figure 10:
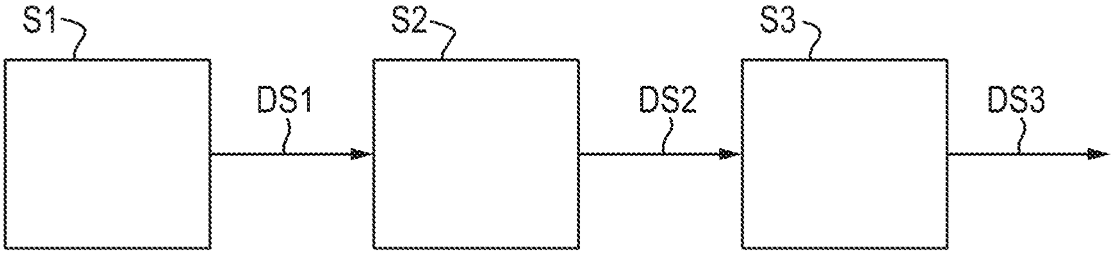
FIG. 10 is a flow diagram of a method, according to some embodiments of the present disclosure.

As depicted in FIG. 10, the present disclosure addresses the problem of processing data at a high rate by providing a two-step process, or at least a process of at least two steps. (Although featuring more than two steps, the process may be referred to as a 'two-step' process). A charged particle assessment device generates S1 a sample image datastream DS1 of data points, each representing a property of a location on the sample as it affects generation of signal particles, i.e. backscatter and/or secondary electrons. A first defect detection test is applied S2 to the sample image datastream DS1. The first detection test is applied S2 to the sample image to select data points, and/or groups of data points, representing regions of the sample, that might contain a defect. The data points that have been selected are output as a reduced datastream DS2. Reduced datastream DS2 has a lower data rate than sample datastream DS1 by virtue of selectivity of the first defect detection test. A second defect detection test is applied S3 to the selected data of the reduced datastream DS2. That is the second detection test S3 determines with greater accuracy whether or not the selected defects are actually have defects. That is second defect detection test is used to determine whether or not any of the regions identified by the first defect detection test as potentially containing a defect, actually do have a defect. Data points determined by the second defect detection test as defects are output in output datastream DS3.

Desirably, the two-step process is performed simultaneously to, or in parallel with, the generation of the sample-image datastream so that the data of interest, i.e., the data or regions identified as possibly containing defects, is identified at an early stage. Uninteresting data therefore need not be stored or processed further. However, in other circumstances it may be desirable to perform the two-step process on stored data. For example, the two-step process may be performed on data from at least two sources, one of which is stored data. Another data source for such a two-step process may be a datastream.

Figure 11:
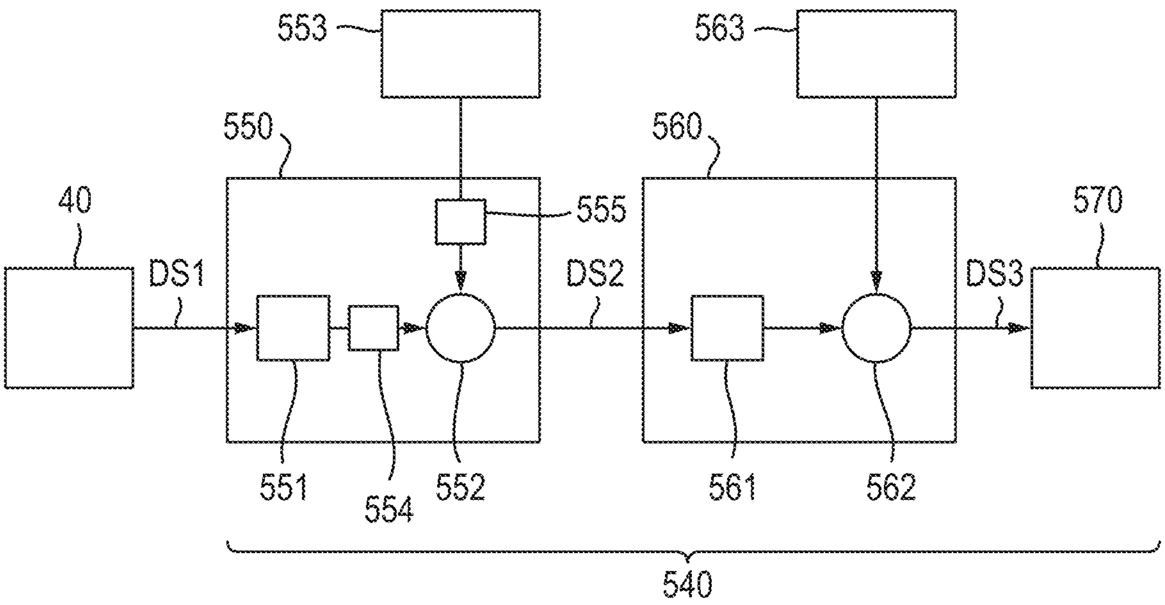
FIG. 11 is a schematic diagram of a data processing device, according to some embodiments of the present disclosure.

A hardware arrangement according to some embodiments to affect this method is depicted in FIG. 11. A data processing device 540 for detecting defects in sample image data is connected a charged particle assessment system 40. Data processing device 540 comprises a first processing module 550 and a second processing module 560. The first processing module 550 is configured to receive a sample image datastream DS1 from the charged particle assessment system 40, the sample image datastream comprising an ordered series of data points representing an image of the sample. The first processing module 550 applies the first defect detection test to select a subset of the sample image datastream as first selected data, e.g., in the form of reduced datastream DS2. The first defect detection test is a localized test which is performed in parallel with receipt of the sample image datastream. Receipt of the sample image datastream in some embodiments is compared to buffered data obtained from other parts of the sample. Such buffered data may be considered to be stored data which is streamed for processing such in the first defect detection test. "Localised" means that the test is performed on a target pixel and a small number of adjacent pixels (e.g., less than 50) rather than requiring the whole image to be considered. The hardware arrangement applies a method of data processing for detecting defects in data for example images. That is, the data represents an image of the sample, e.g., a portion of the sample. The data is generated by an assessment system for assessing the sample. So, the method is of data processing for detecting defects in sample image data generated by an assessment system. In the method: data that is generated by the assessment system is received. The data is received in a data-stream. This may be a sample image datastream received from the assessment system. The sample image datastream may comprise an ordered series of data points representing an image of the sample. A first test is applied to select a subset of the data. The first test is applied to the data in the datastream. The first test comprises a simple algorithm. In the first test the simple algorithm is applied to the data. Such a simple algorithm is the localized test. The first test (or first defect detection test, for example the localised test,) may be in parallel with receiving the data (e.g., as the sample image datastream). The application of the first detection test may comprise selecting a subset of the sample image datastream as first selected data.

The second processing module 560 is configured to receive the first selected data. The second processing module 560 applies a second defect detection test to select a subset of the first selected data as second selected data. The second processing module 560 outputs the second selected data, e.g., as output datastream DS3, to output buffer 570. The second processing module 560 may apply any suitable defect detection test to detect defects. A suitable defect detection test may involve very computationally intensive tests such as high-resolution image comparison, pattern recognition or machine learning techniques. The second processing module may also perform other image processing steps, such as filtering or noise reduction. Thus, the method applied by the hardware arrangement may apply a second test. The second test may be applied to the subset to verify whether at least a portion of the subset of the data is representative of at least one defect. The second test is a complex or expensive algorithm for application to data. The algorithm may result in relatively computationally intensive operations when applied to data, desirably the sub-set of the data. For the application of the second text, the first selected data may be received. The second defect detection test may be applied to the first selected data. Application of the second defect detection test may comprise selecting a subset of the first selected data as second selected data. The second selected data may be representative of a defect.

The two-step process is able to cope with a high data rate without excessive hardware requirements because the first processing module in effect selects a fraction of the data of the sample image for further analysis by the second processing module (or later processing module). Thus, a small proportion of the sample image datastream is selected and subject to further analysis by the second processing module. The proportion maybe as a little as less than 10%, desirably less than 5%, more desirably less than 2%.

Desirably, the first processing module 550 applies the first defect detection test using a first number of operations per pixel. The second processing module applies the second defect detection test using a second number of operations per pixel. The first number of operations is less than the second number of operations. The processing requirement is reduced if the first defect detection test is simpler than the second defect detection test.

Desirably, the first processing module 550 applies the first defect detection test using less than 200, desirably less than 100 operations per pixel. When the first defect detection test is implemented in a small number of operations it is easy to perform at high speed, for example using dedicated hardware. In particular it is desirable that the first processing module uses only simple operations such as: AND, OR, NOT, NAND, XOR, addition, subtraction, bit shifts.

The first defect detection test may have a lower selectivity than the second defect detection test. That is the first detection test generates a higher rate of false positives (regions flagged as possibly having a defect but that actually do not). If the first defect detection test rejects a high proportion of true negatives (regions without defects), the overall data processing requirement can be reduced. Such a reduction can be achieved even if a significant proportion of false positives are generated by the first defect detection test.

Desirably, the first processing module 540 includes a filter module 551 that performs a convolution of the data points of the sample image datastream with a kernel of predetermined size. Application of such a filter can be implemented in a small number of operations and is effective to reduce noise in the image data.

Desirably, the first processing module includes a comparator 552 which compares data points of the sample image datastream to first reference image data 553. First reference image data may be obtained in various different ways as described below. A comparison of data points in the sample image data stream to corresponding pixels in the reference image may be performed in a small number of operations.

Desirably, the first processing module comprises an input buffer 554 configured to buffer the sample image datastream. The input buffer 554 may have a capacity less than an amount required to store an image of a whole pattern repeat region of the sample. A pattern repeat region of the sample is region which contains a pattern that is repeated elsewhere on the sample. Pattern repeat regions are nominally identical. In many cases, a pattern repeat region will correspond to a die or target portion of the sample (a semiconductor substrate having devices formed thereon) but the pattern repeat region may in some cases be smaller than a die or may correspond to plurality of combined dies. Input buffer 554 is depicted as located after the filter module 551 but may be before it or in parallel.

Desirably, the first processing module 550 comprises a reference buffer 555 configured to buffer the first reference image data 553. The reference buffer may have a capacity less than an amount required to store first reference image data of a whole pattern repeat region of the sample. The amount of buffer storage required can be minimized by scanning and processing smaller regions of the sample at a time.

Desirably, the first reference image data has a lower resolution than the image of the sample.

Preferably the second processing module compares the first selected data to second reference image data. Preferably the first reference image data is a lower resolution version of the second reference image data. Using a lower resolution reference image reduces the amount of data that needs to be supplied to the first processing module to enable the comparison.

Desirably, the first processing module comprises a field programmable gate array or an application-specific integrated circuit. Dedicated hardware such as a simple processor for example an FPGA or ASIC can efficiently perform straightforward computations at high rates. A simple processor can be small in size with low power consumption so that it is easier to locate close to the data source in the charged particle assessment device.

Desirably, the first defect detection test generates a first defect score. The first defect score indicates the likelihood that a pixel of the sample image represents a defect. A pixel having a defect score indicating that it has a significant chance of being a defect is referred to as a defect candidate. The first processing module comprises an output buffer configured to accumulate data of regions of the image containing candidate defects. The accumulated data of the regions containing candidate defects may be the first selected data. The accumulated data of the regions containing candidate defects may have the highest values of the first defect score.

Desirably, a charged particle beam system and a data processing device are integrated into a charged particle assessment system. Desirably, the charged particle beam system is located in a vacuum chamber. The first processing module is at least partially located in the vacuum chamber. The second processing module is located at least partly if not completely outside the vacuum chamber. A part of the first processing module may be located outside the vacuum chamber or a part of the second processing module may be located inside the vacuum chamber; such a first processing module and a second processing module may be partially inside and outside the vacuum chamber and so may be distributed processing modules.

Desirably, the charged particle beam system is a multi-column beam system. A multi-column system generates data at a high rate. Thus, a multi-column system benefits greatly from the disclosed embodiments. Desirably, there are a plurality of first processing modules, each associated with a respective one of the columns of the multi-column beam system. There may be fewer second processing modules than first processing modules. The overall requirement for processing hardware can be reduced by having multiple first processing modules feeding selected data to one second processing module. This might be achievable because the quantity of data to be processed by the second processing module is substantially less than the data processed by the first processing modules.

Various approaches may be taken to detect defects in images generated by a charged particle assessment device. A particularly suitable test usable as the first defect detection test performed by the first processing module is to compare an image of a part of the sample, referred to herein as a sample image, to a reference image. In practice, data points of a datastream representing the sample image are compared to data points of the reference image retrieved from a memory or delivered in a parallel data stream. For the sake of brevity, this process may be referred to below as comparing images and the data points as pixels. Any pixel that differs from the corresponding pixel of the reference image may be considered a defect. Such a pixel that differs from the reference image, together with adjacent pixels that also differ from the reference image, is considered a single defect.

(In some embodiments this may mean a pixel differing from the reference image and which has adjacent pixels which are the same as the reference image (i.e., do not differ from the reference image) can be considered to not represent a defect). The reference image may be obtained in various different ways, as discussed below.

The rate of false positives, i.e., samples being labelled as having defects when in fact no significant defect is present, can be controlled. The rate of false positives can be controlled by setting before a defect is flagged a threshold for determining the presence of a defect. The threshold may be the difference of the pixel compared to the reference image, e.g., compared to the equivalent pixel of the reference image. The rate of false positives is further controlled by applying noise reduction to either or both of the reference image and the sample image. However, noise reduction increases the amount of processing required to detect defects.

An efficient and effective approach to reduce noise in the sample image is by applying a simple filter by convolution, e.g., a uniform filter (convolution with a uniform kernel). To reduce noise in the reference image multiple source images may be averaged. In some cases, e.g., where the reference image is obtained by simulation from design data (often in GDSII format), noise reduction on the reference image may be omitted.

The efficiency and effectiveness of noise reduction in the sample image may be optimized by suitable selection of the size of the (uniform) filter. The optimum size of the filter may depend on factors such as the resolution of the sample images and the size of features on the sample being inspected. The size of the kernel used to implement the filter may be equal to a non-integer number of pixels. A width in the range of 1.1 to 5 pixels, desirably in the range of 1.4 to 3.8 pixels, for the kernel is suitable in a variety of use cases. The form of the uniform kernel is discussed further below.

Noise reduction by use of a uniform filter lends itself well to implementation on dedicated hardware, such as FPGAs or ASICs, enabling highly efficient and fast processing.

The averaging performed on source images to obtain a reference image may vary depending on the nature of the source images. Where the source images derive from a library of past scans, a large number of (e.g., more than 20, more than 30 or about 35) images may be averaged to obtain the reference image since the averaging can be performed off-line. The source images may be aligned before averaging.

Alternatively, the sample image may be compared to a reference image derived from "live" source images obtained from different parts of the same sample. In this case fewer, e.g., two, source images may be averaged to obtain the reference image. The two source images may be obtained from corresponding regions of different dies of the sample. Alternatively, if the pattern being inspected has a repeating element, the source images may be obtained from the same die. In some cases, the source images may be shifted portions of the sample images. In cases where the sample image is compared to a reference image derived from live source images, the roles of the different images may rotate. For example, if three images A B and C are output by a charged particle assessment device: A and B may be averaged to provide a reference image to compare to C; A and C may be averaged to provide a reference image to compare to B; while B and C are averaged to provide a reference image to compare to A.

Another possibility is that the reference image is obtained from one or more "known-good" patterns. Another possibility is that the reference image is obtained by simulation, e.g., based on pattern data (e.g., in GDSII format). Such a reference image, at least by a first processing module e.g., in a first step of a two-step process, may be a simplification of the one or more "known-good" patterns or the simulation.

The result of the comparison of a sample image to a reference image may be a simple binary value representing a difference or a correspondence (i.e., matching) between the sample and references images. More desirably, the result of the comparison is a difference value representing the magnitude of the difference between the sample image and the reference image. Desirably, the result of the comparison is a difference value for each pixel (or each group of adjacent pixels which may be referred to a 'region of pixels') so that locations of defects within a source image can be determined greater precision.

To determine if a difference of a pixel or a region of pixels between source image and reference image represents a defect in the pattern being inspected, a threshold may be applied to the difference value corresponding to the pixel or region of pixels. The threshold may be fixed in advance, e.g., for a specific charged particle beam system or for a specific pattern to be inspected. The threshold may be a user-set parameter or by other conditions, for example it is updated from time to time dependent on application or from assessment. The threshold may be determined dynamically, updated during the course of processing, or both. Alternatively, a predetermined number of locations having the highest difference values may be selected as candidate defects for further inspection. Adjacent pixels having difference values higher than a threshold may be considered a single defect or candidate defect. All pixels of a single defect may be ascribed the same difference value. Such adjacent pixels and all pixels of a single defect may be referred to as a region of pixels.

An efficient approach to identifying a predetermined number of locations having the highest difference values is to process pixels in sequence and write pixel information and difference values to a buffer. Pixel information may include a region of pixel data surrounding a pixel or group of pixels identified as a potential defect. Such a region of pixel data may be referred to as a clip. If the buffer is full and a newly processed pixel has a higher difference value than the pixel in the buffer with the lowest difference value, the pixel information relating to the pixel with the lowest difference value is overwritten. In one possible implementation, until the buffer is full, the threshold for selection of pixels is set at a predetermined level. When the buffer is full the threshold is updated to the lowest difference value of the pixels stored in the buffer and updated each time a pixel in the buffer is overwritten. In this way only one comparison need be performed. Alternatively, the threshold can be maintained constant and initially selected pixels can be separately tested to see if they have a higher difference than a pixel in the buffer already. Such a method may select a predetermined proportion of pixels and a predetermined amount of data. Alternatively, the threshold may be set to select pixels that exceed the threshold so that the selected pixels that are tested have a magnitude corresponding or exceeding the set threshold. In such a method the proportion of pixels is not predetermined; so the quantity of data selected is un-predetermined. The proportion of pixels selected may depend on the set of data being processed. Since the number of selected pixels in such methods is much lower than the total number of pixels, further processing of the selected pixels can be performed asynchronously (e.g., by a different processor) from initial processing without reducing throughput.

A processing module 500, that can be used as the first processing module 550, is depicted in FIG. 9. Processing module 500 comprises a filter module 501 which receives and filters a sample image from a charged particle assessment system 40, a reference image generator 503 which generates a reference image based on source images, a comparator 502 which compares the filtered sample image to the reference image and an output module 504 which processes and outputs the result of the comparison.

Filter module 501 applies a filter, e.g., a uniform filter, of predetermined size to the sample image. Applying a uniform filter comprises convoluting the sample image with a uniform kernel.

The size of the uniform kernel is determined, e.g., by the user, for inspection of a given sample based on, for example, the size of features on the sample, the size of defect to be detected, the resolution of the charged particle assessment device, the amount of noise in the images and the desired compromise between sensitivity and selectivity. The size of the uniform kernel does not have to be an integer number of pixels. For example, for pixel sizes in the range of from 5 to 14 nm and defects of order of 20 nm, a uniform kernel with a width in the range of 1.1 to 5 pixels, desirably in the range of 1.4 to 3.8 pixels, is advantageous by providing a high selectivity and high sensitivity.

Figure 12:
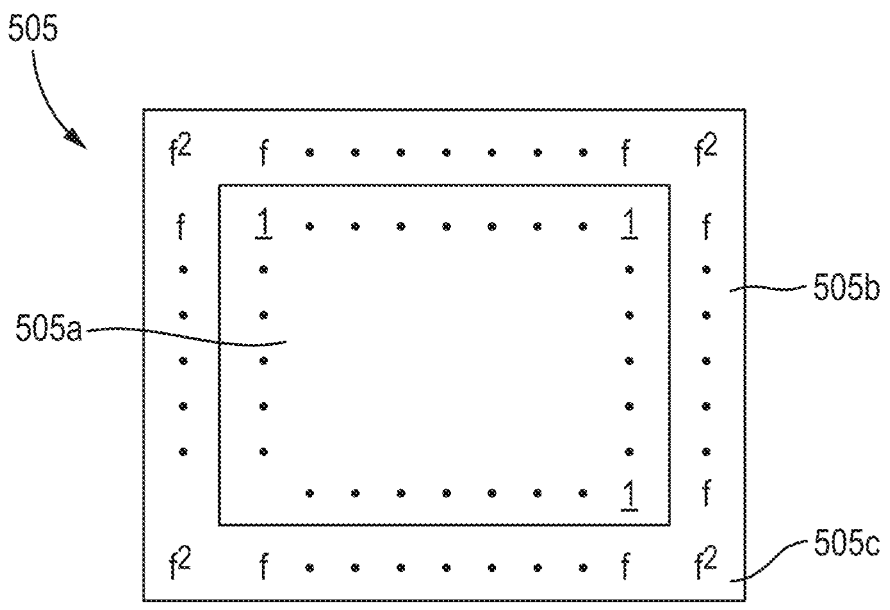
FIG. 12 is a diagram of a uniform kernel, according to some embodiments of the present disclosure.

A square uniform kernel 505 with a non-integer size (width) is depicted in FIG. 12. Such a uniform kernel comprises a central region 505*a* of n×n values, all of which are 1, and a peripheral region 505*b* made up of a top row, a bottom row, a left column and a right column. All of the values of the peripheral region are f, where f<1, except the corner values which are $f^2$. The effective size of the uniform kernel is equal to n+2f pixels. Optionally, the uniform kernel may be normalized (i.e., all values divided by a constant so that the sum of all values is 1). Alternatively, or in addition, the filtered sample image may be normalized or rescaled.

In some cases, e.g., the uniform kernel described above, a two-dimensional kernel can be decomposed into two one-dimensional convolutions in orthogonal directions which are applied sequentially. This can be advantageous because the number of operations to perform an n×n two-dimensional convolution scales with the square of n whereas the number of operations to perform two n one-dimensional convolutions scales linearly with n.

The kernel need not be square and may, for example, be rectangular or any other convenient shape. The filter function implemented by the kernel need not be the same shape and size as the kernel; a kernel that is larger than the filter function will include zero values. Desirably the filter is symmetrical but that is not essential. Simulations performed by the inventors suggest that a kernel implementing a uniform provides good results but some deviation from a mathematically uniform filter is permissible. For example, corner filters could have values f, which would slightly overweight those pixels but not significantly. Non-uniform filters, e.g., a Gaussian filter, may be conveniently implemented by convolution with a suitable kernel.

Filter module 501, especially when configured to apply a uniform filter of predetermined size, is conveniently implemented by dedicated hardware, e.g., an FPGA or an ASIC. Such dedicated hardware can be more efficient and economic than programmed general purpose computing devices such as a standard or common type of CPU architecture. The processor may be less powerful than a CPU but may have architecture suited to processing software for processing the detection signal data, i.e., the images and so be capable of processing the images in the same or less time than the CPU. Such detected processing architecture, despite having a processing capability lower than most contemporaneous CPUs may be as fast at processing the data because the more efficient data architecture of the dedicated processing architecture.

Figure 13:
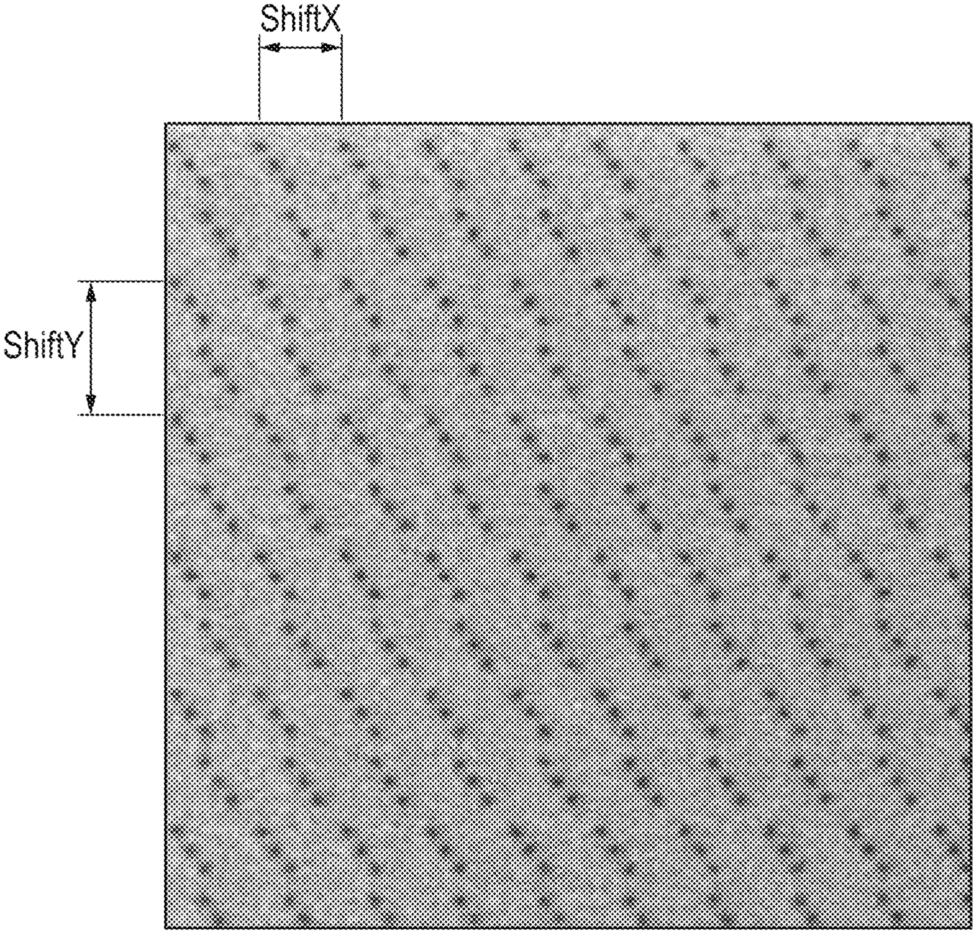
FIG. 13 is an example of an SEM image on which the methods of the disclosed embodiments may be performed.

FIG. 13 is, by way of an example, an image, or even part of an image and thus a clip, of a sample generated by a charged particle assessment device. It will be seen that the sample inspected has a repeating pattern of features with a unit cell of size indicted by the dimensions ShiftX and ShiftY.

The reference image generator 503 may be operable in one or more modes, each mode representing a different approach to generation of the reference image.

In a library mode, the reference image generator 503 averages a large number of source images obtained from previous scans of patterns nominally the same as the pattern currently being assessed. Such images may have been generated earlier in the same batch of samples, or from samples in previous batches. The library images may be derived from test samples or production samples. Before averaging the images are desirably aligned with one another. Averaging the source images to generate the reference image has the effect of reducing noise. Averaging the source images in this way also averages away any defects that might be visible in the source images.

In the case where the pattern being inspected is a repeating pattern, as shown for example in FIG. 13, it is possible to generate the reference image by averaging a plurality of shifted versions of a source image. Each version of the source image is shifted by integer multiples of ShiftX and/or ShiftY. If either or both dimensions of the unit cell are not equal to an integer number of pixels, the shift amount can be rounded to the nearest pixel or a fractional pixel shift can be affected by interpolation, for example linear or cubic interpolation, such as bicubic interpolation, or any other known interpolation technique. Another possibility is to shift by a multiple of the pitch of the repeating pattern such that the multiple is an integer number of pixels. In effect, multiple instances of the unit cell are extracted from the source image and averaged. This approach may be referred to as an example of array mode, more specifically of providing a reference image for an array mode.

In a die-to-die mode, three columns of a multi-column charged particle assessment device are used to generate a sample image and two reference images. An image aligner is provided to align the images before they are supplied to the reference image generator 503 and filter module 501 as appropriate. This arrangement is particularly efficient where the spacing between columns is equal to the die size of the sample being inspected since the columns will then automatically scan corresponding pattern features simultaneously. In case there is a difference between the column spacing and die size, a buffer may be employed to correct the timing of image input to the data processing device.

In an alternative variant of die-to-die mode, the same beam (of the same column in the case of a multi-column system) is used to generate a sample image and two reference images. This has the advantage that column to column and beam to beam corrections are not required and the routing of data can be simplified. For example, such a calibration is the relative position of a beam relative to the ideal beam position for that beam or even for each beam. Using the same beam avoids the calibration, e.g., assessment of the offset, between beams for the different scans that are compared. Using the same beam means that although the beam has an offset with respect to the ideal beam position, there is no positional offset to correct for when comparing data retrieved from the scans. However, the need for data buffering might be increased, for example in frequency, if not in quantity of data buffered before the start of the comparison of the data from different dies.

An alternative version of array mode using single column 507, e.g., of a single-column system, provides a sample image which is compared against a reference image derived from two shifted versions of itself as source images. A buffer may be used to provide the shifted images.

It should be noted that it is also possible to apply the uniform filter to the source images and/or the reference images, in particular where the reference image is derived from a small number of source images that are obtained concurrently with the source image.

With reference again to FIG. 9, comparator 502 may be any logic circuit capable of comparing two values, for example an XOR gate or a subtractor. Comparator 502 is also suitable for implementation by dedicated hardware, e.g., an FPGA or an ASIC. Such dedicated hardware can be more efficient and economic than programmed general purpose computing devices, e.g., CPUs. Desirably, comparator 502 is implemented on the same dedicated hardware as filter module 501.

In some cases, the reference image generator 503 can also be implemented in dedicated hardware, especially where the reference image generator operates only in a mode where the reference image is generated from a small number of, e.g., two, source images. In that case it is desirable that the reference image generator is implemented in the same dedicated hardware as the comparator and/or filter module. The mathematical operations to average pixels of source images and compare to a pixel of a sample image can, in suitable cases, be combined into a single logic circuit.

Output module 504 receives the results output by comparator 502 and prepares output to the user or other fab systems. The output may be in any of several different forms. In a simplest option, the output may simply be an indication that the sample has or does not have a defect. However, since almost all samples will have at least one potential defect more detailed information is desirable. Therefore, the output may comprise, for example, a map of defect locations, a difference image, and/or information as to the severity of a possible defect represented by the magnitude of the difference between the sample image and the reference image. Output module 504 may also filter the potential defects, e.g., by only outputting defect locations where the magnitude of the difference between the sample image and the reference is greater than a threshold or the density of pixels showing a difference is higher than a threshold. Another possibility is to output only a predetermined number of most serious defect sites, indicated by the magnitude of the difference. This may be affected by storing defect sites in a buffer 510 and, when the buffer is full, overwriting the lowest magnitude defect if a higher magnitude defect is detected.

Any suitable format for the output of defect information may be used, e.g., a list or a map. Desirably, output module 504 may output clips, that is images of regions of the sample where potential defects have been detected. This allows the potential defect to be further examined to determine if the defect is real and serious enough to affect operation of the device formed on or present in the sample. The rest of the source image, i.e., those parts not saved as clips, may be discarded to save on data storage and transfer requirements.

In a charged particle inspection system, each electron optical system 41 is located within main (vacuum) chamber 10 and may be any one of the electron optical systems 41, 41', 41" or 41'" described above. It is therefore necessary to transmit data from the electron optical system(s) to devices outside the vacuum chamber. Raw data generated by the electron optical system(s) can be transmitted out of the vacuum chamber using an optical transceiver that is located near the detector module 240 of the electron optical system 41. The optical transceiver is configured to convert the electrical signals output by the detector module 240 to optical signals for transmission along an optical fiber. Optical fiber may be capable of transmitting multiple channels simultaneously (e.g., using different wavelengths). Thus, the detection signals from each individual electrode of the detector module are converted into an appropriate number of data streams. Multiple optical fibers, either as single channel or multi-channel optic fibers, can be used. Each optical fiber passes through the wall of main chamber 10 (inside of which is at vacuum in use) by a vacuum feedthrough. A suitable vacuum feedthrough is described in US 2018/0182514 A1 which document is incorporated herein by reference at least insofar as it relates to a feedthrough device. The optical fiber is connected to first processing device 550, which can therefore be located outside the vacuum for ease of access and to avoid needing to increase the size of the vacuum chamber to accommodate the data processing device.

An alternative or an additional arrangement is to place the first processing module(s) close to the detector module(s). This is convenient particularly if such a first processing module compromises simplified dedicated processors such as FGPAs, and is at least signally connected to the optical transceiver and optical fiber. The optical transceiver and the optical fiber transmit the first selected data to the second processing module located outside the main chamber. This arrangement reduces the number of optical fibers that must be passed through the wall of the vacuum chamber as the data rate of the first selected data is much lower than the output of the detector module(s).

In both single-column and multi-column systems, multiple optical transceivers and multiple optical fibers per column may be used if convenient.

In methods for detecting defects where a sample image is compared to a reference image derived from other regions of the same sample, it has previously been proposed to scan whole pattern repeat regions (possibly excluding non-critical regions) to derive the reference image(s). Thus, the reference image(s) are derived before scanning the sample region to obtain the sample image. Such a sample image is compared to the previously derived reference image(s). The present inventors have determined that this is not the most efficient approach. The present inventors propose instead that scans are made of only a part of each of a plurality of (e.g., two) pattern repeat regions as reference regions and the corresponding part of the pattern repeat region to be inspected. The pattern repeat region to be inspected may be referred to as the sample region. The sample region and the reference regions are scanned before data processing to detect defects begins and that other parts of the reference regions and sample region are scanned subsequently.

Thus, in some embodiments, a method using a charged particle beam system of detecting defects in samples having a plurality of pattern repeat regions, the method comprises, in order a first scan, second scan, a third scan and a subsequent scan. In the first scan, a first part of a first region of the pattern repeat regions is scanned to generate first scan image data. In the second scan, a first part of a second region of the pattern repeat regions is scanned to generate second scan image data. The second region is spaced apart from the first region. In the third scan, a first part of a third region of the pattern repeat regions is scanned to generate third scan image data. The third region is spaced apart from the first region and the second region. The subsequent scan of a second part of the first region is scanned to generate fourth scan image data.

The first, second and third scan image data can be used to detect defects using a variety of different processes. For example, two of the scan image data can be used as source images to derive a reference image against which the other one of the scan image data is compared. Alternatively, a form of majority voting can be applied between the three scan image data. Detection methods based on machine-learning techniques (e.g., trained on labelled defect and non-defect images) are also suitable.

A variety of advantages can accrue from the above arrangements. For example, by selecting the size of each part region that is scanned, the amount of buffer memory required can be determined;

hence a desired trade-off between costs of the apparatus and throughput can be achieved.

Desirably, during the first, second, third and fourth scans the sample is at least mechanically scanned in a single direction relative to the electron-optical system. In this case, it is not necessary to stitch together multiple scans to create an image of the sample, thereby avoiding the need to overscan for the stitching process and reducing the computational workload. A small amount of overscan is desirable to enable the images of different scan regions to be aligned with each other prior to comparison. This amount of overscan depends on the accuracy of positioning and the time between scans (for example to account for thermal expansion of the sample) but is likely to be less than required for stitching. Detailed implementations of overscan are described below.

In the case that the charged particle beam system has a plurality of beams, it is desirable that the first, second and third scans are performed such that the same beam is used to scan corresponding parts of respective pattern repeat regions. In this way, beam-to-beam differences do not contribute errors to the comparison of images. Also, it is not necessary that beam or column spacing matches the pitch of pattern repeat regions (e.g., dies) of the sample. Although such an arrangement may permit real-time comparison of the data in multiple data streams, such a comparison would require calibration between the data streams to compensate for the use of different beams for each data stream.

The above method is particularly useful when used with a two-step processing method comprising: a first sub-process and a second sub-process. The first sub-process of applying a first defect detection test is to select a subset of one of the first, second and third scan image data as first selected data. The second sub-process of applying a second defect detection test is to select a subset of the first selected data as second selected data.

This two-step processing method may be as described above with reference to FIGS. 9 to 13.

Desirably, when a two-step process is used to detect defects (i.e., the two-step process is a two-step defect detection test), the time taken for the first sub-process is less than or equal to the time interval between the start of the first scan and the start of the fourth scan.

It is desirable to buffer the first scan image data at least until generation of the second scan image data is started. Processing of the first scan image data and the second scan image data can then start even while the second scan image data is generated. For example, filtering or denoising processes can be performed. This can reduce the net processing time. However, such processing is incomplete because a third image data set is required for full processing.

It is also desirable to buffer the first and second scan image data at least until generation of the third scan image data is started. Processing of all three sets of scan image data can start while the third image data scan is generated, for example with the datastream of the third image data scan. Processing time can be reduced.

It is also desirable to buffer the first, second and third scan image data.

A more detailed example of this part region scan approach is described below with reference to FIGS. 14A, 14B, 14C, 15 and 16.

Figure 14A:
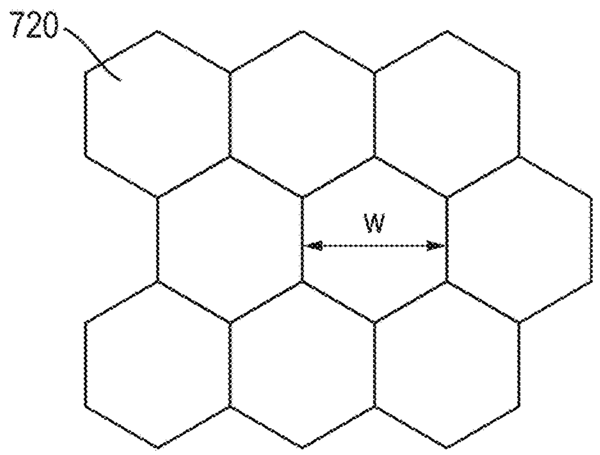
FIGS. 14A, B and C are schematic diagrams of fields of view of sub-beams, a sub-beam processed area, a multi-beam field of view in a charged particle assessment system.
Figure 14B:
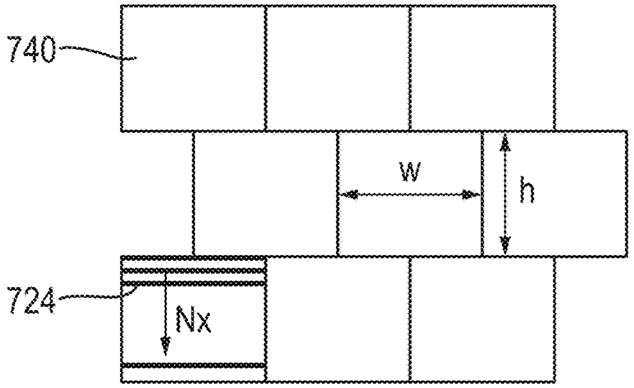
Figure 14C:
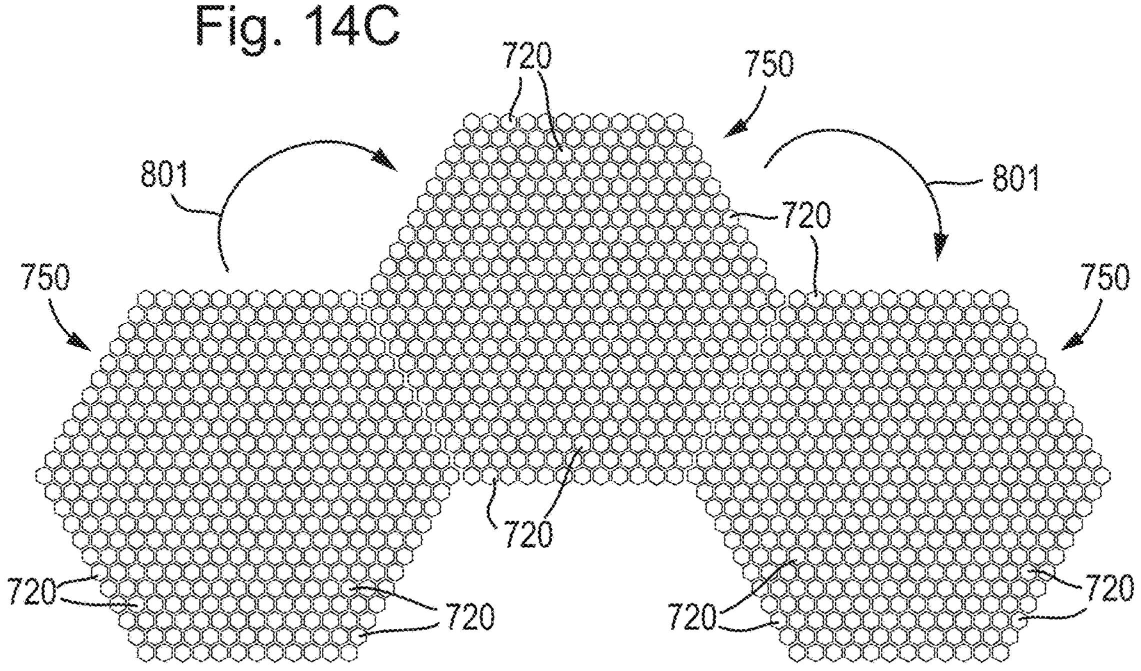

FIGS. 14A, 14B and 14C depict an example relationship between a geometry of the multi-beam arrangement of a multi-beam electron-optical system as a grid of sub-beam fields of view 720 and a geometry of sub-beam process areas 740. The relationship between the geometry of the multi-beam arrangement and the geometry of the sub-beam process areas 740 enables continuous coverage of a sample. The symmetry of the grid of sub-beams does not need to be the same as the symmetry of the sub-beam process areas 740. In the example shown, the sub-beams are provided on a hexagonal grid (i.e., a grid having hexagonal symmetry) and each sub-beam has a hexagonal beam field of view 720. The sub-beam process areas 740 (each of which is scanned by a single sub-beam) are rectangular. Having rectangular sub-beam process areas may be desirable because the geometry for scanning may be less complex than that may be required for a hexagonal grid of sub-beam process areas. Continuous coverage of the sample surface parallel to the first direction (horizontally in the orientation depicted) is achieved by arranging for the distance of movement of the sample 208 in a scan to be equal to a pitch w of the grid of sub-beams in the first direction (i.e., the width of the tessellating hexagons 720). The length of the elongate regions and/or of the sub-beam process areas associated with each sub-beam may thus be equal to the pitch w. Continuous coverage of the sample surface parallel to the second direction (vertically in the orientation depicted) is achieved by arranging for the cumulative distance of steps $\underline{N_y}$ between scans in the sub-beam process area, e.g., of width w. The dimension h of the sub-beam process areas 740 in the second direction is set to be equal to a pitch of the grid of sub-beams in the second direction. The fields of view 720 of the sub-beams of the multi-beam electron-optical system may combine to form a multi-beam field of view 750 that is also hexagonal in shape. To scan a continuous area of the sample, the sample is stepped in macro-steps 801 that are at an angle to the first direction, for example in the range of 40 to 70 degrees. The scans at the different steps may be at least contiguous, so together covering the continuous area of the sample. (More generally the fields of view 720 of the sub-beams may be of similar size and shape that tessellate within the grid. The multi-beam field of view 750 may be of a shape that tessellates with similar fields of view over the surface of a sample, substantially covering the surface; that is portions of the sample successively in the multi-beam field of view 750 may tessellate together for a substantially continuous surface).

In a specific example case where the sub-beams are provided in a hexagonal array, the pitch of the hexagonal array may be in the range of from 50 to 100 micron pitch. The rectangular sub-beam process areas 740 would have a width of $0.5\times\sqrt{3}$ times the pitch of the hexagonal array. In an example case where the field of view of an objective lens in the objective lens array is about 1 micron, to cover one sub-beam process area 50 to 100 mechanical scans of elongate regions 724 (or stripes). Note: in a different arrangement the sub-beams may be provided in an array having a grid of a different shape, for example parallelogram, rhombus, rectangular or square. For each shape of beam arrangement, the sub-beam processed areas 740 may be rectangular.

To implement the scanning, each beam of the multi-beam arrangement is assigned a process area 740. Depending on the electron-optic design, different processing strategies could be used by the assigned sub-beam to process its process area. In some embodiments, the sub-beam is scanned mechanically by a lateral stage move so that the sub-beam and sample scan laterally across the process area 740. The sub-beam is electrostatically scanned for example by a scan deflector orthogonal, or at least angled relative to, a direction of the lateral stage move. Such an electrostatic scan may determine the breadth of an elongate region for example 0.5 to 5 micron. The stage is stepped between the elongate regions of the process region. All the sub-beams are scanned over the sample surface of the respective assigned process areas. The sample surface assigned to the grid of sub-beams is thus processed. The stage and multi-beam arrayed are moved relative to each other, e.g., the stage is stepped, so that an unprocessed area of the sample surface is assigned to the grid of sub-beams for processing, i.e., scanning. In another arrangement, the scanning is mechanical, for example by stage movement. In an alternative arrangement, the scanning is electrical, for example the elongate region is scanned using scan deflectors optionally scanning orthogonally, at least angled to the direction of the elongate region so as to define the breadth of the elongate region. In some embodiments, a different combination of mechanical and electrical scanning actuators is used (noting that a scanning actuator may be a stage movement or an electrostatic scan deflector).

Figure 17:
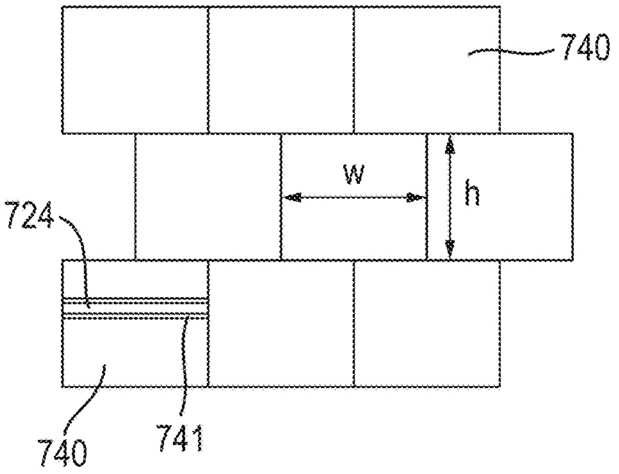
FIG. 17 is a diagram illustrating overscan per stripe.
Figure 18:
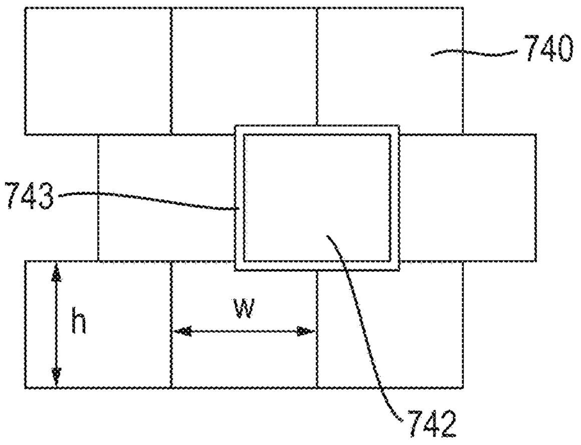
FIG. 18 is a diagram illustrating overscan per pattern repeat area.
Figure 19:
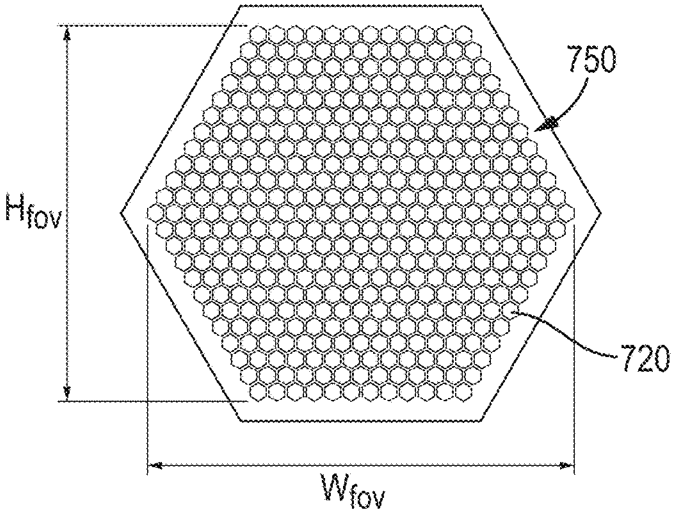
FIG. 19 is a diagram illustrating overscan per field of view of a multi-beam electron optical column.

Different types of overscan that may be employed in an arrangement as shown in FIGS. 14A to C are depicted in FIGS. 17 to 19. In general, the term overscan refers to scanning a larger area than the nominal area to be processed. Overscan can be performed for various different reasons: e.g., to enable data of adjacent scans to be stitched together to form an image of larger area; or to account for alignment error (the location of the region of interest not being known exactly); or for a combination of reasons. Where overscan is used to avoid stage alignment steps in a method of image comparison, the areas scanned on the sample are larger than the areas of the images that are compared. In other words, the image comparison is performed for a subset of the scan image data that represents the area of overlap of the scans. The size of the extra area scanned may be relatively small compared to the areas of the images compared.

FIG. 17 depicts a form of overscan that may be referred to as stripe overscan. In stripe overscan an additional margin 741 is scanned by increasing the breadth of a stripe 724 (or elongate region) in the direction perpendicular to the scanning direction on the sample surface. This may be achieved through electron-optically scanning of the sub-beam in suitable cases, for example using an electromagnetic scan deflector and/or electronic scanning. The breadth of the scan may also be increased if desired through adjustment of the mechanical scan of the sample. Stripe overscan can address beam or sample drift during the scan (for example the drift in the relative position of the beam and wafer); beam or sample drift between scans in a die-to-die mode; and/or matching stage movement to die spacing. By way of example, the amount of stripe overscan may be up to about 10% of the stripe breadth.

FIG. 18 depicts a form of overscan that may be referred to as pitch area overscan (or overscan for the process area 742). In pitch area overscan an additional margin 743 around the sub-beam process area 742 is scanned. This can be achieved through increasing the length of the stripes 724 that are scanned and/or increasing the breadth of one or more, or all, of the stripes 724. Increasing the breadth of a stripe 724 of the process area may be achieved applying stripe overscan.

Pitch area overscan may comprise stripe overscan. Additionally or alternatively, the pitch overscan may be achieved by one or more extra stripes 724. If an extra stripe is used to achieve pitch area overscan, an extra stripe should be included in scanning the pitch areas that are used to derive data for comparison, for example a similar pitch area of each of the different dies for example by the same beam. Pitch area overscan can address beam or sample drift during the scanning of a whole sub-beam process area and/or imperfections in the sub-beam grid. By way of example, the amount of stripe overscan may be up to about 2% of the larger dimension of the sub-beam process area.

This considers the comparison of images that are taken by the same beam. Use of the same beam may impact the overscan. By using the same beam to make the images that are compared, a number of errors are included in the "pitch area overscan". Such errors may be imperfections of the beam grid and beam or wafer drift on the time scale of up to the process area. If different beams are used to make the three images that are compared, the imperfects would feature in the "stripe overscan". This is advantageous because the "pitch overscan" can be made much larger than the "stripe overscan". The imperfections can be accommodated in a larger area permitting more imperfections to be made with low or impact for example on the comparison of the image data.

FIG. 19 depicts a form of overscan that may be referred to as multi-beam field of view overscan. In multi-beam field of view overscan, rather than increase the field of view of the multi-beam column (which would require adding extra beams) the field of view is only selectively used. The width w or $W_{fov}$ and the height h or $H_{fov}$ of the multi-beam field of view are maintained; the relative position of the multi-beam field of view 750 may be shifted to achieve the overscan. Multi-beam field of view overscan can address fully covering the area selected for inspection, for example scanning rectangular areas on the sample using hexagonal fields of view (i.e., a dissimilar shape to the selected area for inspection), inaccuracy in sample alignment and/or failing beams. Thus, adjoining scans of multiple multi-beam fields may be at least contiguous, so that the adjoining scans scan a continuous area of a sample surface. In fully covering the area selected for inspection there is overlap of adjacent scans of the multi-beam field of view 750. The overlap between different adjacent scans of the multi-beam field of view is similar.

Figure 15:
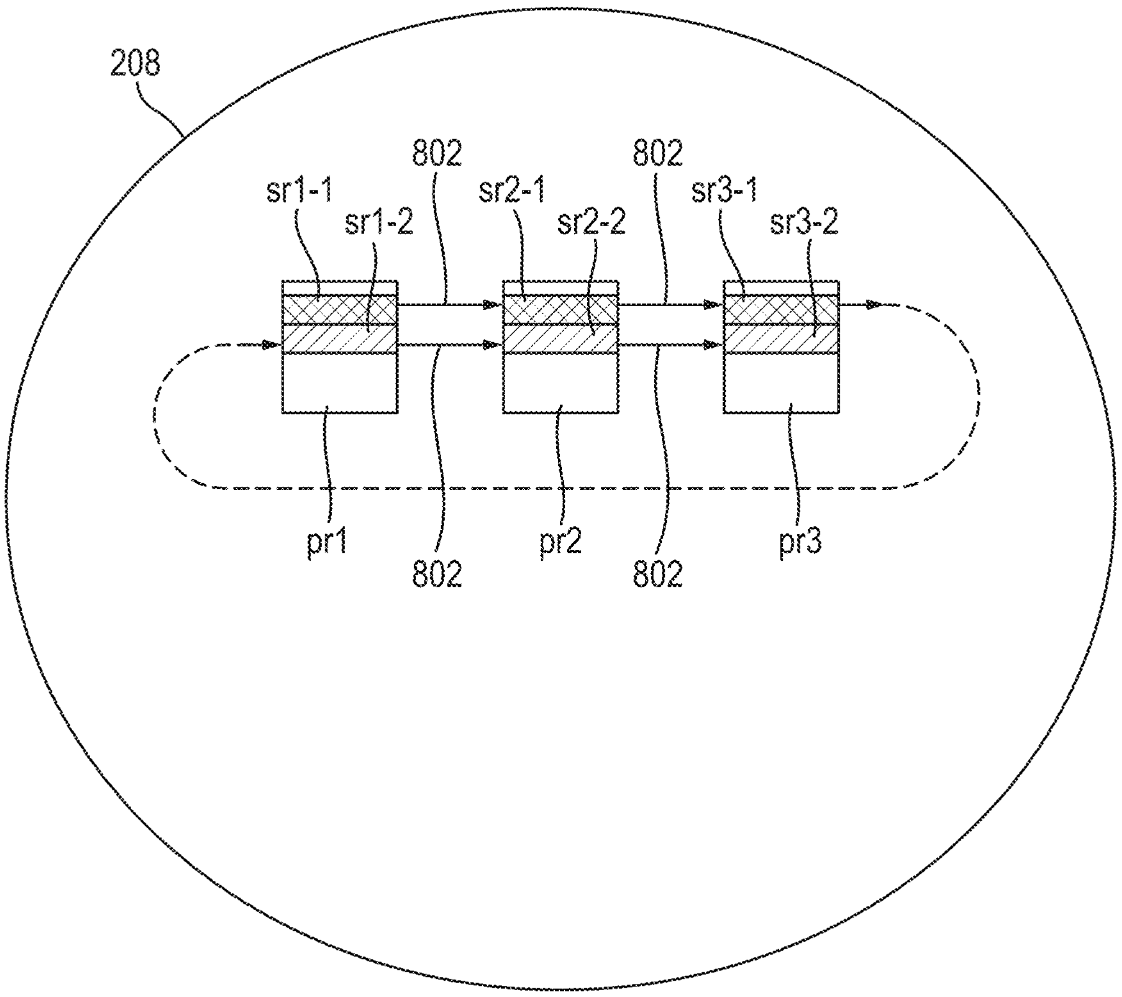
FIG. 15 is a schematic diagram of scan areas and pattern repeat regions on a sample.
Figure 20:
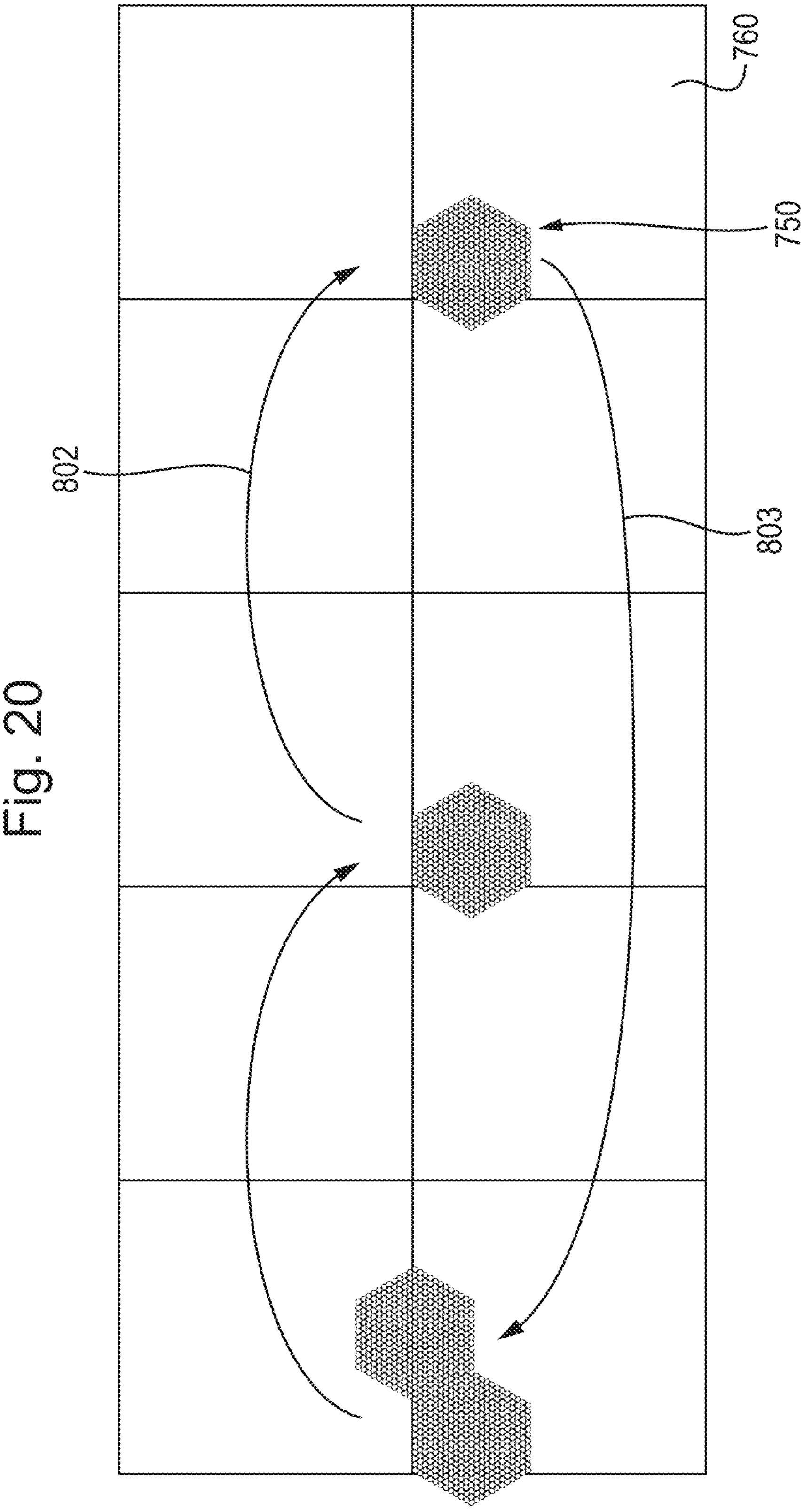
FIG. 20 is a diagram illustrating a step and scan sequence.

To implement the part region scan approach, the order of scans is modified as depicted in FIG. 15. A first part, referred to as a scan region, sr1-1 of a first pattern repeat region pr1 is scanned using a sub-beam of the electron optical system. The sample 208 is displaced (stepped) under the electron-optical system so that the sub-beam is positioned at the start of a second scan region sr2-1 of second pattern repeat region pr2 which is then scanned. The sample 208 is stepped to the start of third scan region sr3-1 of third pattern repeat region pr3 which is scanned. The first to third scan regions sr1-1, sr2-1 and sr3-1 all relate to corresponding parts of the pattern repeat. The datastreams resulting from the scans of first to third scan regions sr1-1, sr2-1 and sr3-1 are processed as described above to detect defects. The process is repeated for fourth to sixth scan regions sr1-2, sr2-2 and sr3-2. It will be appreciated that pattern regions pr1, pr2, pr3 need not be positioned in a line as indicated in FIG. 15 but can be located anywhere on the sample and may be adjacent or spaced apart. Successive scans of scan regions sr1-n, sr2-n, sr3-n of the three pattern repeat regions pr1, pr2, pr3 may be made until the selected portion (which may be all or a portion) of the respective pattern repeat regions pr1, pr2, pr3 are scanned. The scans of the scan regions do not need to be in the same direction. In this approach, the length of each scan may be different than the length discussed above with reference to FIGS. 14A, 14B and 14C and is dictated more by the size of the pattern repeat region (field pitch) than the characteristics of the electron-optical system 40. Therefore, the selected portion of the pattern repeat region may be scanned by several at least adjoining scans of the grid of sub-beams as required. To ensure that no portion of the sample surface is missed, the adjoining scans of the multi-beam arrangement may overlap, preferably a substantially minimal amount to reduce the impact of a reduced throughput. FIG. 20 depicts a step and scan sequence for the above part region scan approach using a hexagonal multi-beam field of view with a sample having a rectilinear grid of pattern repeat regions 760. Steps 802 are performed between the first parts of the three regions and step 803 is the return step to start a new part of the first region.

Some charged particle assessment systems are known to require alignment after each stage move to address drift in alignment between the stage, and thus the sample held on it, and the path of the multi-beam. In other systems drift may be limited enough for alignment to be needed but still present. Therefore, precise movement of the stage when stepping between different sample portions for scanning may make it harder to ensure that each beam scans a corresponding portion of each pattern repeat region (e.g., die). As mentioned above, using the same beam to scan corresponding portions of each pattern repeat region is preferred because it avoids need for calibrating the displacement of each beam path from an ideal beam path.

It is proposed to avoid or reduce time-consuming alignment steps using overscan, in particular. stripe overscan as described above. Stripe overscan can be performed to increase the length and/or width of the scanned stripes. The amount of overscan required depends on the amount of drift experienced between scans. Where overscan is used to avoid alignment steps in the charged particle assessment tool, additional image alignment steps might be required for example during processing such as for analysis of the scan image data.

For defect detection purposes, a set of scan regions, relating to corresponding parts of a plurality (e.g., three) different pattern repeat regions are scanned. To cover more of the pattern repeat region, multiple sets of scan regions are scanned. Within each set it is not necessary that the order of scans is the same. It is also not necessary that the whole of the pattern repeat region is scanned.

Scanning, and defect detection, can be limited to parts of the pattern repeat region where defects are most likely to arise. Locations likely to have defects can be predicted from simulations, as disclosed in US 2019/0006147 A1, which document is incorporated herein in respect of its disclosure of predicting locations of defect hotspots.

It is also not necessary that, after scanning one scan region in each of pattern repeat regions pr1 to pr3, the scanning of further scan regions in the same set of pattern repeat regions follows directly. A different set of pattern repeat regions may be scanned first. However, it is desirable, to reduce data buffering, that all scan regions that are to be used in a given defect detection test are scanned successively.

Figure 16:
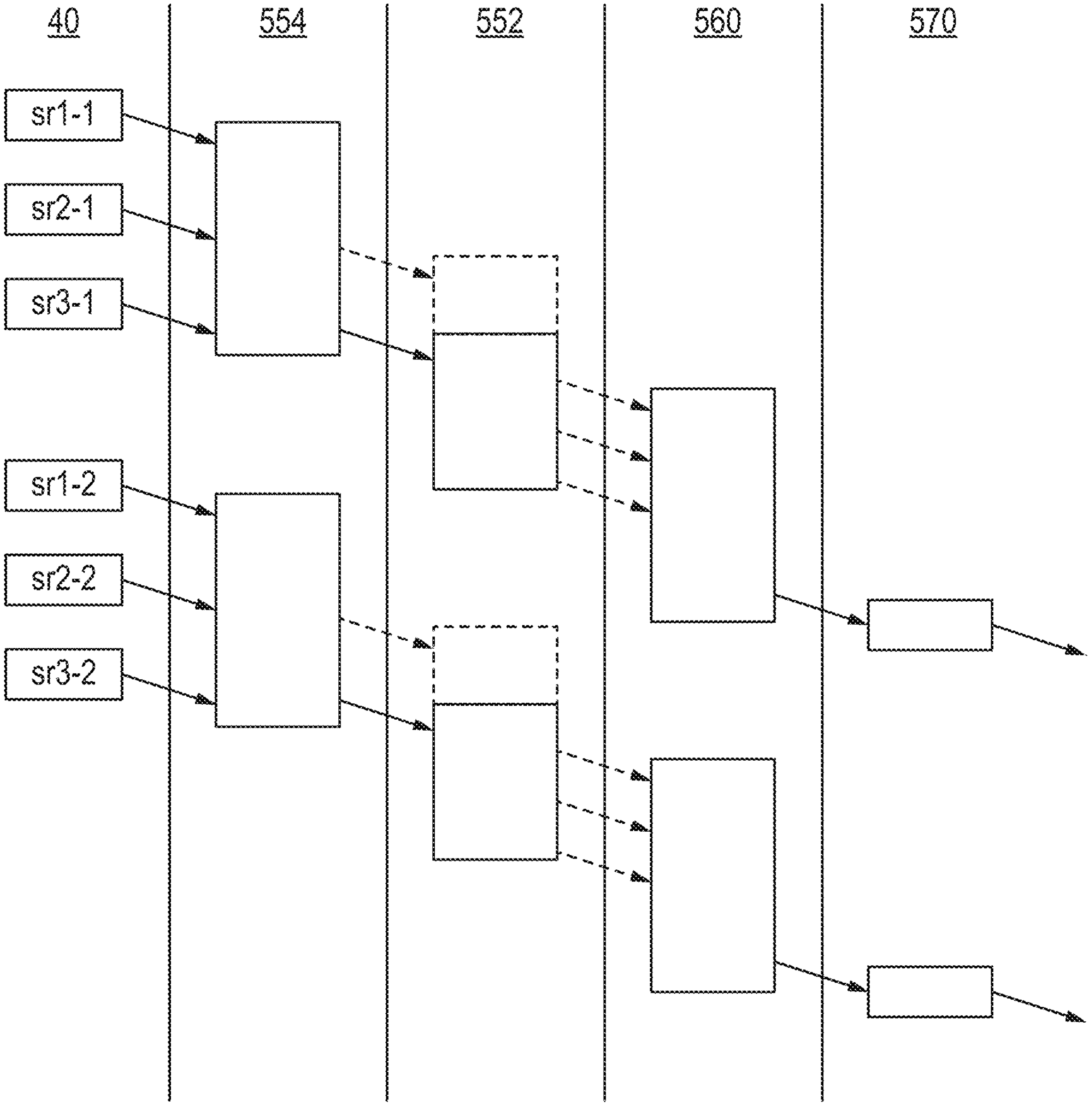
FIG. 16 is a swim-lane diagram of a method, according to some embodiments of the present disclosure.

The sequence of scanning and data processing actions is depicted in FIG. 16 which is a swim-lane diagram depicting the actions performed by electron beam system 40, input buffer 554, comparator 552, second processing module 560 and output buffer 570. As scans of scan regions sr1-1, sr2-1, sr3-1 progress in turn, information is accumulated in input buffer 554. Depending on the nature of the first defect detection test, processing can start as soon as data relating to the second of the scan regions is available. For example, if two scan images are to be averaged to form a reference for comparison to the third, or as soon as data for the third scan region is available.

As defects are detected by the first processing module, data is sent to the second processing module 560. The second processing module 560 is able then to start applying the second defect detection test. Information representing defects detected in the second defect detection test are sent to the output buffer 570. Desirably, processing by the first processing module of a first set of scan regions takes no more time than the scan of those regions. The time taken to step the sample to the beginning of the scan of the next set of scan regions so that the data processing does not limit throughput. (As discussed above, it is noted that the next set of scan regions need not relate to the same pattern repeat regions as the first set of scan regions.)

References to upper and lower, up and down, above and below, etc. should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

The embodiments herein described may take the form of a series of aperture arrays or electron-optical elements arranged in arrays along a beam or a multi-beam path. Such electron-optical elements may be electrostatic. In some embodiments all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e., using MEMS manufacturing techniques). Electron-optical elements may have magnetic elements and electrostatic elements. For example, a compound array lens may feature a macro magnetic lens encompassing the multi-beam path with an upper and lower pole plate within the magnetic lens and arranged along the multi-beam path. In the pole plates may be an array of apertures for the beam paths of the multi-beam. Electrodes may be present above, below or between the pole plates to control and optimize the electro-magnetic field of the compound lens array.

An assessment tool or assessment system according to the disclosure may comprise apparatus which makes a qualitative assessment of a sample (e.g., pass/fail), one which makes a quantitative measurement (e.g., the size of a feature) of a sample or one which generates an image of map of a sample. Examples of assessment tools or systems are inspection tools (e.g., for identifying defects), review tools (e.g., for classifying defects) and metrology tools, or tools capable of performing any combination of assessment functionalities associated with inspection tools, review tools, or metrology tools (e.g., metro-inspection tools).

Reference to a component or system of components or elements being controllable to manipulate a charged particle beam in a certain manner includes configuring a controller or control system or control unit to control the component to manipulate the charged particle beam in the manner described, as well optionally using other controllers or devices (e.g., voltage supplies) to control the component to manipulate the charged particle beam in this manner. For example, a voltage supply may be electrically connected to one or more components to apply potentials to the components, such as to the electrodes of the control lens array 250 and objective lens array 241, under the control of the controller or control system or control unit. An actuatable component, such as a stage, may be controllable to actuate and thus move relative to other components such as the beam path using one or more controllers, control systems, or control units to control the actuation of the component.

Functionality provided by the controller or control system or control unit may be computer-implemented. Any suitable combination of elements may be used to provide the required functionality, including for example CPUs, RAM, SSDs, motherboards, network connections, firmware, software, and/or other elements known in the art that allow the required computing operations to be performed. The required computing operations may be defined by one or more computer programs. The one or more computer programs may be provided in the form of media, optionally non-transitory media, storing computer readable instructions. When the computer readable instructions are read by the computer, the computer performs the required method steps. The computer may consist of a self-contained unit or a distributed computing system having plural different computers connected to each other via a network.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector. References to elements being aligned along a beam path or sub-beam path are understood to mean that the respective elements are positioned along the beam path or sub-beam path. References to optics are understood to mean electron-optics.

The methods of the present disclosure may be performed by computer systems comprising one or more computers. A computer used to implement the disclosed embodiments may comprise one or more processors, including general purpose CPUs, graphical processing units (GPUs), Field Programmable Gate Arrays (FPGAs), Application Specific Integrated Circuits (ASICs) or other specialized processors. As discussed above, in some cases specific types of processor may provide advantages in terms of reduced cost and/or increased processing speed and the method of the disclosed embodiments may be adapted to the use of specific processor types. Certain steps of methods of the present disclosure involve parallel computations that are apt to be implemented on processers capable of parallel computation, for example GPUs.

The term "image" used herein is intended to refer to any array of values wherein each value relates to a sample of a location and the arrangement of values in the array corresponds to a spatial arrangement of the sampled locations. An image may comprise a single layer or multiple layers. In the case of a multi-layer image, each layer, which may also be referred to as a channel, represents a different sample of the locations. The term "pixel" is intended to refer to a single value of the array or, in the case of a multi-layer image, a group of values corresponding to a single location.

A computer used to implement the disclosed embodiments may be physical or virtual. A computer used to implement the disclosed embodiments may be a server, a client or a workstation. Multiple computers used to implement the disclosed embodiments may be distributed and interconnected via a local area network (LAN) or wide area network (WAN). Results of a method of the disclosed embodiments may be displayed to a user or stored in any suitable storage medium. The embodiments of the present disclosure may be embodied in a non-transitory computer-readable storage medium storing instructions to carry out a method of the invention. The embodiments of the present disclosure may be embodied in computer system comprising one or more processors and memory or storage storing instructions to carry out a method of the invention.

Aspects of the disclosed embodiments are set out in the following numbered clauses.

Clause 1: A data processing device for detecting defects in sample image data generated by a charged particle assessment system, the device comprising: a first processing module configured to receive a sample image datastream from the charged particle assessment system, the sample image datastream comprising an ordered series of data points representing an image of the sample, and to apply a first defect detection test to select a subset of the sample image datastream as first selected data, wherein the first defect detection test is a localised test which is performed in parallel with receipt of the sample image datastream; and a second processing module configured to receive the first selected data and to apply a second defect detection test to select a subset of the first selected data as second selected data.

Clause 2: A device according to clause 1 wherein the first processing module applies the first defect detection test using a first number of operations per pixel and the second processing module applies the second defect detection test using a second number of operations per pixel, the first number of operations being less than the second number of operations.

Clause 3: A device according to clause 1 or 2 wherein the first processing module applies the first defect detection test using less than 200, desirably less than 100 operations per pixel.

Clause 4: A device according to clause 1, 2 or 3 wherein operations performed by the first processing module are selected from the group consisting of: AND, OR, NOT, NAND, XOR, addition, subtraction, bit shifts.

Clause 5: A device according to clause 1, 2, 3 or 4 wherein the first defect detection test has a lower selectivity than the second defect detection test.

Clause 6: A device according to any one of the preceding clauses wherein the first processing module performs a convolution of the data points of the sample image datastream with a kernel of predetermined size.

Clause 7: A device according to any one of the preceding clauses wherein the first processing module comprises an input buffer configured to buffer the sample image datastream, preferably wherein the input buffer has a capacity less than an amount required to store an image of a whole pattern repeat region of the sample.

Clause 8: A device according to any one of the preceding clauses wherein the first processing module compares data points of the sample image datastream to first reference image data.

Clause 9: A device according to clause 8, wherein the first processing module comprises a reference buffer configured to buffer the first reference image data, preferably wherein the reference buffer has a capacity less than an amount required to store first reference image data of a whole pattern repeat region of the sample.

Clause 10: A device according to clause 8 or 9, wherein the first reference image data has a lower resolution than the image of the sample, preferably the second processing module compares the first selected data to second reference image data, preferably the first reference image data is a lower resolution version of the second reference image data.

Clause 11: A device according to any one of the preceding clauses wherein the first processing module comprises a field programmable gate array or an application-specific integrated circuit.

Clause 12: A device according to any one of the preceding clauses wherein the first selected data comprises a region of pixels surrounding pixels of the image data that meet the first defect detection test.

Clause 13: A device according to any one of the preceding clauses wherein the first defect detection test generates a first defect score indicating the likelihood that a pixel of the sample image represents a defect, and the first processing module further comprises an output buffer configured to accumulate, as the first selected data, data of regions having the highest values of the first defect score.

Clause 14: A charged particle assessment system comprising a charged particle beam system and a data processing device according to any one of the preceding clauses.

Clause 15: A charged particle assessment system according to clause 14 wherein the charged particle beam system and the first processing module are located in a vacuum chamber and the second processing module is located outside the vacuum chamber.

Clause 16: A charged particle assessment system according to clause 14 or 15 wherein the charged particle beam system is a multi-column beam system.

Clause 17: A charged particle assessment system according to clause 16 wherein there are a plurality of first processing modules, each associated with a respective one of the columns of the multi-column beam system, there being fewer second processing modules than first processing modules.

Clause 18: A charged particle assessment system according to clause 16 wherein the first processing module is configured to receive scan image data from detectors associated with corresponding beams in a plurality of columns of the multi-column beam system.

Clause 19: A charged particle assessment system according to clause 16, 17 or 18 wherein the columns of the multi-column beam system are arranged such that the same beam is used to scan corresponding parts of a plurality of pattern repeat regions, preferably the columns are spaced apart a distance corresponding to the distance between a plurality of pattern repeat regions, preferably wherein the pattern repeat regions are different dies on the sample.

Clause 20: A method using a charged particle beam system of detecting defects in samples having a plurality of pattern repeat regions, the method comprising, in order: a first scan of a first part of a first region of the pattern repeat regions to generate first scan image data; a second scan of a first part of a second region of the pattern repeat regions to generate second scan image data, the second region being spaced apart from the first region; a third scan of a first part of a third region of the pattern repeat regions to generate third scan image data, the third region being spaced apart from the first region and the second region; and a subsequent scan of a second part of the first region to generate fourth scan image data. Desirably a pattern repeat region of the sample is a region which contains a pattern that is repeated elsewhere on the sample, for example as one or more of the first region, the second region and the third region, desirably all of the first, second and third regions. Desirably pattern repeat regions are nominally identical. Desirably a pattern repeat region corresponds to a die or target portion of the sample. In some embodiments the pattern repeat region may be smaller than a die. In some embodiments, the pattern repeat region may correspond to plurality of combined dies.

Clause 21: A method according to clause 20 wherein during each of the first, second, third and fourth scans the sample is scanned in a single direction relative to the charged particle beam system.

Clause 22: A method according to clause 20 or 21 wherein the charged particle beam system has a plurality of beams and the first, second and third scans are performed such that the same beam is used to scan corresponding parts of respective pattern repeat regions.

Clause 23: A method according to clause 20, 21 or 22 wherein further comprising processing the first, second and third scan data to detect defects in one of the first, second or third pattern repeat regions.

Clause 24: A method according to clause 23 wherein processing the first, second and third scan data comprises processing a subset of each of the first, second and third scan data representing corresponding areas of the first second and third regions.

Clause 25: A method according to clause 23 or 24, wherein processing comprises: a first sub-process of applying a first defect detection test to select a subset of one of the first, second and third scan image data as first selected data; and a second sub-process of applying a second defect detection test to select a subset of the first selected data as second selected data.

Clause 26: A method according to clause 25 wherein the time taken for the first sub-process is less than or equal to the time interval between the start of the first scan and the start of the fourth scan.

Clause 27: A method according to any of clauses 20 to 26 wherein each of the first, second and third scan image data comprises data from scans of multiple multi-beam field of views on the sample.

Clause 28: A method according to clause 27, wherein adjoining scans of the multiple multi-beam field of views are at least contiguous on the sample.

Clause 29: A method according to clause 27 or 28, the multiple multi-beam field of views covering respective samples areas corresponding to the first, second and third image data.

Clause 30: A method according to any of clauses 27 to 29, wherein each multi-beam field of view of the multiple multi-beam field of views comprises multiple process areas, each process area corresponding to a field of view a beam of the plurality of beams.

Clause 31: A method of clause 30, wherein the first, second and third image data derived from scanning of at least one of the multi-beam field of views is achieved by overscanning.

Clause 32: A method of clause 31, wherein in the overscanning at least one of the beams of the plurality of beams associated with one of the multi-beam field of views is overscanned by pitch overscanning.

Clause 33: The method of clause 32, wherein in the pitch overscanning the associated beam scans an area of the sample larger than the process areas of the associated beam.

Clause 34: The method of clause 32 or 33, wherein in the pitch overscanning the associated beam scans an area of the sample that is at least contiguous an area of the sample (e.g., process area) scanned by an adjoining beam to the associated beam in the plurality of beams.

Clause 35: A method according to any of clause 32 to 34, wherein in the pitch overscanning comprises: extending multiple scans across the sample, so preferably that the corresponding scanned elongate regions are longer than the width of the process area; broadening the breadth of one or more scans across the sample (or stripe overscanning), so preferably that the corresponding elongate scans comprise an elongate region and an additional margin, preferably the additional margin being at least contiguous with the area of a sampled scanned in an adjoining elongate scan; and/or scanning one or more extra scans across the sample, so preferably that the scanned area of the sample by the sum of the area scanned by the scans across the sample is larger than the process area.

Clause 36: A method of any of clauses 32 to 35, wherein using the overscanning at least one of the beams of the plurality of beams ensures similar beams of the plurality of beams are used to generate respective data of the first, second and third image data for processing to detect defects.

Clause 37: A method of any of proceeding clauses 20 to 36, wherein the subsequent scan scans an area of the sample that is at least contiguous with at least one of the first, second and third regions.

Clause 38: A method of clause 37, wherein overscanning is used to ensure that the area scanned for the subsequent scan is contiguous with at least one of the first, second and third regions, preferably the overscanning comprising at least one of multi-beam field of view overscan, pitch overscan and stripe scan.

Clause 39: A method according to any one of clauses 20 to 38 further comprising buffering the first scan image data at least until generation of the second scan data image data is started.

Clause 40: A method according to any one of clauses 20 to 39 further comprising buffering the first and second scan image data at least until generation of the third scan image data is started.

Clause 41: A method according to any one of clauses 20 to 40 further comprising buffering the first, second and third scan image data.

Clause 42: A method, using a charged particle beam system, of detecting defects in a sample using a charged particle multi-beam comprising a plurality of sub-beams, the sample having a plurality of pattern repeat regions that are nominally identical regions, the method comprising, in order: a first scan of a first pattern repeat region of the sample using the charged particle multi-beam to generate first scan image data; a second scan of a second pattern repeat region of the sample using the charged particle multi-beam to generate a second scan image data, the second pattern repeat region being spaced apart from the first pattern repeat region; a third scan of a third pattern repeat region of the sample using the charged particle multi-beam to generate a third scan image data, the third pattern repeat region being spaced apart from the first pattern repeat region and the second pattern repeat region; and processing the first scan image data, the second scan image data and the third scan image data by comparing the first scan image data, the second scan image data and the third scan image data to identify a defect; wherein each sub-beam is assigned a portion of the first, second and third pattern repeat regions so that each scan comprises using the same sub-beam to scan corresponding portions of the respective pattern repeat regions; wherein the processing comprises comparing scan image data obtained by the same sub-beam from corresponding portions of respective pattern repeat regions.

Clause 43: A method using a charged particle beam system of detecting defects in a sample using a charged particle multi-beam comprising a plurality of sub-beams, the sample having a plurality of pattern repeat regions that are nominally identical, the method comprising: successively scanning at least three different pattern repeat regions of the sample using the charged particle multi-beam to generate different first sample image data sets; processing the different first sample image data sets, by comparing the image data thereof regions to identify a defect; wherein each sub-beam is assigned a corresponding portion of each of the pattern repeat regions so that each scanning comprises using the same sub-beam to scan corresponding portions of the respective pattern repeat regions.

Clause 44: A method of data processing for detecting defects in sample image data generated by a charged particle assessment system, the method comprising: receiving a sample image datastream from the charged particle assessment system, the sample image datastream comprising an ordered series of data points representing an image of the sample, applying a first defect detection test that is a localised test, the applying the first detection test comprising selecting a subset of the sample image datastream as first selected data, wherein the applying of the first defect detection test is in parallel with receiving of the sample image datastream; receiving the first selected data; applying a second defect detection test, the applying of the second detection test comprising selecting a subset of the first selected data as second selected data.

Clause 45: A method of data processing for detecting defects in data (for example images) generated by an assessment system assessing a sample, the method comprising: receiving data generated by the assessment system, the data representing an image of the sample, applying a first test to select a subset of the data; and applying a second test to the subset to verify whether at least a portion of the subset of the data is representative of at least one defect Clause 46: The method of data processing of clause 45, wherein the data is received in a data-stream Clause 47: The method of data processing of clause 46, wherein the first test is applied to the data in the datastream Clause 48: The method of data processing of any of clauses 45 to 47, wherein the first test comprises a simple algorithm for application to the data, for example a localized test Clause 49: The method of data processing of any of clauses 45 to 48, wherein the second test is a complex algorithm for application to data, desirably the sub-set of the data Clause 50: The method of data processing of any of clauses 45 to 49, wherein the application of the first test is in parallel with receiving the data Clause 51: A method of data processing for detecting defects in sample image data generated by an assessment system, the method comprising: receiving a sample image datastream from the assessment system, the sample image datastream comprising an ordered series of data points representing an image of the sample, applying a first defect detection test that is a localised test being in parallel with the receiving of the sample image datastream, the applying of the first detection test comprising selecting a subset of the sample image datastream as first selected data; receiving the first selected data; and applying a second defect detection test to the first selected data and comprising selecting a subset of the first selected data as second selected data representative of a defect Clause 52: The method of data processing of any of clauses 44 to 51, wherein the assessment system is a charged particle assessment system.

Clause 53: A computer program comprising instructions configured to control a processor to perform the method of any of the clauses 20 to 52.

While the embodiments of the present disclosure have been described in connection with various embodiments, other embodiments will be apparent to those skilled in the art from consideration of the specification and practice of the embodiments disclosed herein. It is intended that the specification and examples be considered as exemplary only, with a true scope and spirit of the invention being indicated by the following claims.

The invention claimed is:

1. A system for detecting defects in sample image data generated by a charged particle beam system, the system comprising:

a first processing module including circuitry configured to:

receive a sample image datastream from the charged particle beam system, the sample image datastream comprising an ordered series of data points representing an image of a target sample; and perform a first defect detection test on the sample image datastream to select a subset of the sample image datastream as first selected data, wherein the first defect detection test performs a first number of comparator operations per pixel; and a second processing module including circuitry configured to perform a second defect detection test on the first selected data to generate second selected data indicating defects, wherein the second defect detection test performs a second number of comparator operations per pixel, the first number of comparator operations being less than the second number of comparator operations.

2. The system of claim 1, wherein the first processing module is further configured to perform the first defect detection test using less than 200 comparator operations per pixel.

3. The system of claim 1, wherein comparator operations used by the first defect detection test are selected from the group consisting of: AND, OR, NOT, NAND, XOR, addition, subtraction, bit shifts.

4. The system of claim 1, wherein the first processing module is further configured to:

receive the sample image datastream at a sample image data rate; and transmit the first selected data to the second processing module at a data rate that is less than the sample image data rate.

5. The system of claim 1, wherein the first processing module is further configured to:

filter noise in the sample image datastream based on a convolution of the data points of the sample image datastream and a kernel of predetermined size.

6. The system of claim 1, wherein the first processing module is further configured to:

buffer the sample image datastream using an input buffer that has a data storage capacity smaller than a data size associated with an image of a die on the target sample.

7. The system of claim 1, wherein the first defect detection test compares data points of the sample image datastream to first reference image data.

8. The system of claim 7, wherein the first processing module is further configured to:

buffer the first reference image data using a reference buffer having a data storage capacity smaller than a data size associated with a reference image of a die on the target sample.

9. The system of claim 7, wherein:

the first reference image data has a resolution that is lower than a resolution of the image of the target sample;

the second defect detection test compares the first selected data to second reference image data; and the first reference image data has a resolution that is lower than a resolution of the second reference image data.

10. The system of claim 1, wherein:

the circuitry in the first processing module comprises a field programmable gate array or an application-specific integrated circuit; and the circuitry in the second processing module comprises a field programmable gate array or an application-specific integrated circuit.

11. The system of claim 1, wherein:

the first processing module is configured to perform the first defect detection test by flagging pixels of the sample image datastream; and the first selected data comprises a region of pixels that include the pixels of the sample image datastream flagged by the first defect detection test.

12. The system of claim 1, wherein:

the first defect detection test generates a first defect score that is indicative of a defect at a pixel of the image of the target sample; and the first processing module is further configured to accumulate, as the first selected data, data of regions of the target sample associated with highest values of the first defect score.

13. A charged particle assessment system, comprising:

a charged particle beam system comprising:

a charged particle beam source configured to generate a beam of primary charged particles;

a charged particle optical system configured to direct the beam of primary charged particles at a target sample; and a charged particle detector system configured to detect secondary charged particles associated with interaction of the primary charged particles with the target sample;

a first processing module including circuitry configured to:

receive a sample image datastream from the charged particle beam system, the sample image datastream comprising an ordered series of data points representing an image of a target sample;

perform a first defect detection test on the sample image datastream to select a subset of the sample image datastream as first selected data, wherein the first defect detection test performs a first number of comparator operations per pixel; and a second processing module including circuitry configured to perform a second defect detection test on the first selected data to generate second selected data indicating defects, wherein the second defect detection test performs a second number of comparator operations per pixel, the first number of comparator operations being less than the second number of comparator operations.

14. The charged particle assessment system of claim 13, wherein the charged particle beam system and the first processing module are disposed in a vacuum chamber and the second processing module is disposed outside of the vacuum chamber.

15. The charged particle assessment system of claim 13, wherein the charged particle beam system is a multi-column beam system configured to provide multiple beams of charged particles.

16. The charged particle assessment system of claim 15, further comprising:

a first number of first processing modules; and a second number of second processing modules, wherein:

each of the first processing modules is associated with a respective column of the multi-column beam system; and the second number of second processing modules is less than the first number of first processing modules.

17. The charged particle assessment system of claim 15, wherein:

the charged particle detector system comprises a plurality of detectors:

each of the detectors is associated with a respective column of the multi-beam column system; and the first processing module is further configured to receive scan image data from the plurality of detectors.

18. The charged particle assessment system of claim 15, wherein columns of the multi-column beam system are configured to scan corresponding parts of a plurality of dies on the target sample.

19. A computer-implemented method of data processing for detecting defects in sample image data generated by a charged particle beam system, the computer-implemented method comprising:

receiving a sample image datastream from the charged particle beam system, the sample image datastream comprising an ordered series of data points representing an image of a target sample;

performing a first defect detection test on the sample image datastream to select a subset of the sample image datastream as first selected data, wherein the first defect detection test performs a first number of comparator operations per pixel;

performing a second defect detection test on the first selected data to generate second selected data indicating defects, wherein the second defect detection test performs a second number of comparator operations per pixel, the first number of comparator operations being less than the second number of comparator operations.

20. The system of claim 1, further comprising:

a first number of first processing modules; and a second number of second processing modules, wherein the second number of second processing modules is less than the first number of first processing modules.

* * * * *